US012274067B2

(12) United States Patent
Chen et al.

(10) Patent No.: US 12,274,067 B2
(45) Date of Patent: Apr. 8, 2025

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Liang Chen, Wuhan (CN); Wei Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 530 days.

(21) Appl. No.: 17/514,678

(22) Filed: Oct. 29, 2021

(65) Prior Publication Data

US 2023/0110729 A1 Apr. 13, 2023

Related U.S. Application Data

(63) Continuation of application No. PCT/CN2021/123562, filed on Oct. 13, 2021.

(51) Int. Cl.
*H10B 43/40* (2023.01)
*H10B 41/20* (2023.01)
(Continued)

(52) U.S. Cl.
CPC ............ *H10B 43/40* (2023.02); *H10B 41/20* (2023.02); *H10B 41/42* (2023.02); *H10B 43/20* (2023.02)

(58) Field of Classification Search
None
See application file for complete search history.

(56) References Cited

U.S. PATENT DOCUMENTS

2009/0168482 A1 7/2009 Park et al.
2016/0013198 A1* 1/2016 Liu .................... H01L 29/42344
438/258

(Continued)

FOREIGN PATENT DOCUMENTS

CN 107863350 A 3/2018
CN 109427814 A 3/2019
(Continued)

OTHER PUBLICATIONS

International Search Report issued in corresponding International Application No. PCT/CN2021/123562, mailed Jul. 8, 2022, 4 pages.

(Continued)

*Primary Examiner* — Dale E Page
*Assistant Examiner* — Derek L Nielsen
(74) *Attorney, Agent, or Firm* — BAYES PLLC

(57) ABSTRACT

In certain aspects, a method for forming a three-dimensional (3D) memory device is disclosed. A transistor is formed in a first region on a first side of a single crystalline silicon substrate. A step layer is formed in a second region on the first side of the single crystalline silicon substrate. A channel structure extending through a stack structure and in contact with the step layer is formed. The stack structure includes interleaved dielectric layers and conductive layers on the step layer. Part of the single crystalline silicon substrate that is in the second region is removed from a second side opposite to the first side of the single crystalline silicon substrate to expose the step layer from the second side.

20 Claims, 25 Drawing Sheets

(51) Int. Cl.
*H10B 41/42* (2023.01)
*H10B 43/20* (2023.01)

(56) References Cited

U.S. PATENT DOCUMENTS

2017/0148810 A1* 5/2017 Kai ...................... H01L 23/535
2019/0252396 A1 8/2019 Mushiga et al.
2020/0258816 A1* 8/2020 Okina ................... H10B 43/40

FOREIGN PATENT DOCUMENTS

| CN | 110010620 A | 7/2019 |
| CN | 110249427 A | 9/2019 |
| CN | 110832638 A | 2/2020 |

OTHER PUBLICATIONS

International Search Report issued in corresponding International Application No. PCT/CN2021/123485, mailed Jul. 11, 2022, 5 pages.

* cited by examiner

THREE-DIMENSIONAL MEMORY DEVICES AND METHODS FOR FORMING THE SAME

CROSS-REFERENCE TO RELATED APPLICATIONS

This application is a continuation of International Application No. PCT/CN2021/123562, filed on Oct. 13, 2021, entitled "THREE-DIMENSIONAL MEMORY DEVICES AND METHODS FOR FORMING THE SAME," which is hereby incorporated by reference in its entirety. This application is also related to U.S. application Ser. No. 17/514,649, filed on Oct. 29, 2021, entitled "THREE-DIMENSIONAL MEMORY DEVICES AND METHODS FOR FORMING THE SAME," which is hereby incorporated by reference in its entirety.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a method for forming a 3D memory device is disclosed. A transistor is formed in a first region on a first side of a single crystalline silicon substrate. A step layer is formed in a second region on the first side of the single crystalline silicon substrate. A channel structure extending through a stack structure and in contact with the step layer is formed. The stack structure includes interleaved dielectric layers and conductive layers on the step layer. Part of the single crystalline silicon substrate that is in the second region is removed from a second side opposite to the first side of the single crystalline silicon substrate to expose the step layer from the second side.

In another aspect, a method for forming a 3D memory device is disclosed. A first semiconductor structure is formed. The first semiconductor structure includes a single crystalline silicon substrate, a first transistor on the single crystalline silicon substrate, a step layer on the single crystalline silicon substrate, and a channel structure on the step layer. A second semiconductor structure including a second transistor is formed. The first semiconductor structure and the second semiconductor structure are bonded in a face-to-face manner. Part of the single crystalline silicon substrate on which the step layer is formed is removed.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
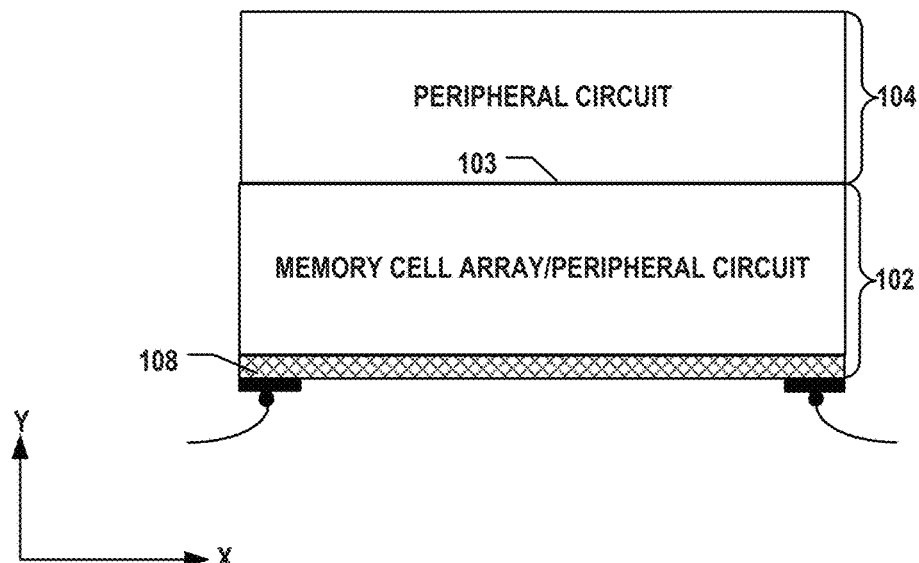
FIG. 1A illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

With the development of 3D memory devices, such as 3D NAND Flash memory devices, the more stacked layers (e.g., more word lines and the resulting more memory cells) require more peripheral circuits (and the components, e.g., transistors, forming the peripheral circuits) for operating the 3D memory devices. For example, the number and/or size of page buffers needs to increase to match the increased number of memory cells. In another example, the number of string drivers in the word line driver is proportional to the number of word lines in the 3D NAND Flash memory. Thus, the continuous increase of the word lines also increases the area occupied by the word line driver, as well as the complexity of metal routings, sometimes even the number of metal layers. Moreover, in some 3D memory devices in which the memory cell array and peripheral circuits are fabricated on different substrates and bonded together, the continuous increase of peripheral circuits' areas makes it the bottleneck for reducing the total chip size since the memory cell array can be scaled up vertically by increasing the number of levels instead of increasing the planar size.

Thus, it is desirable to reduce the planar areas occupied by the peripheral circuits of the 3D memory devices with the increased numbers of peripheral circuits and the transistors thereof. However, scaling down the transistor size of the peripheral circuits following the advanced complementary metal-oxide-semiconductor (CMOS) technology node trend used for the logic devices would cause a significant cost increase and higher leakage current, which are undesirable for memory devices. Moreover, because the 3D NAND Flash memory devices require a relatively high voltage (e.g., above 3.3 V) in certain memory operations, such as program and erase, unlike logic devices, which can reduce its working voltage as the CMOS technology node advances, the voltage provided to the memory peripheral circuits cannot be reduced. As a result, scaling down the memory peripheral circuit sizes by following the trend for advancing the CMOS technology nodes, like the normal logic devices, becomes infeasible.

Furthermore, as the number of stacked layers in 3D NAND Flash memory devices keeps increasing, gate-induced-drain-leakage (GIDL)-assisted body biasing becomes more suitable than other erase mechanisms, such as P-well bulk erase, for erase operations to ensure the erase effectiveness and variability control. However, to generate the GIDL-assisted body biasing, the source of NAND memory strings needs to contact a polysilicon layer, instead of a single crystalline silicon substrate, which becomes incompatible with transistors of the peripheral circuits that are formed in a single crystalline silicon substrate.

To address one or more of the aforementioned issues, the present disclosure introduces a solution in which at least some of the peripheral circuits of a memory device are formed in the same semiconductor structure (e.g., on the same substrate) with the memory cell array (e.g., NAND memory strings) to reduce the planar chip size of the peripheral circuits, as well as the total chip size of the memory device. Moreover, a polysilicon layer and a single crystalline silicon layer with a step height (i.e., nonoverlapping and at least partially noncoplanar) can be formed in the same semiconductor structure to enable integration of peripheral circuits and NAND memory strings that perform GIDL erase operation. In some implementations, the transistors of peripheral circuits are formed in one region of the single crystalline silicon substrate, and a polysilicon layer is formed in another region of the same single crystalline silicon substrate, which can be removed later from the final product, to allow the channel structures of NAND memory strings to be formed on the polysilicon layer to enable GIDL erase operations.

According to some aspects of the present disclosure, the peripheral circuits can be separated into different planes in the vertical direction based on different performance requirements, for example, the voltages applied to the transistors thereof, which affect the dimensions of the transistors (e.g., gate dielectric thickness), dimensions of the substrates in which the transistors are formed (e.g., substrate thickness), and thermal budgets (e.g., the interconnect material). Thus, peripheral circuits with different dimension requirements (e.g., gate dielectric thickness and substrate thickness) and thermal budgets can be fabricated in different processes to reduce the design and process constraints from each other, thereby improving the device performance and fabrication complexity. In some implementations, the memory cell array (e.g., NAND memory strings) and the memory peripheral circuits provided with a relatively high voltage (e.g., above 3.3 V) are formed in the same semiconductor structure due to the high process compatibility thereof.

According to some aspects of the present disclosure, the memory cell array and various peripheral circuits with different performance and dimension requirements can be fabricated in parallel on different substrates and then stacked over one another using various joining technologies, such as hybrid bonding. As a result, the fabrication cycle of the memory device can be further reduced. Moreover, since the thermal budgets of the different devices become independent to each other, interconnect materials with desirable electric performance but low thermal budget, such as copper, can be used in interconnecting the memory cells and transistors of the peripheral circuits, thereby further improving the device performance. Bonding technologies can introduce additional benefits as well. In some implementations, hybrid bonding in a face-to-face manner achieves millions of parallel short interconnects between the bonded semiconductor structures to increase the throughput and input/output (I/O) speed of the memory devices.

FIG. 1A illustrates a schematic view of a cross-section of a 3D memory device 100, according to some aspects of the present disclosure. 3D memory device 100 represents an example of a bonded chip. In some implementations, at least some of the components of 3D memory device 100 (e.g., memory cell array and peripheral circuits) are formed separately on different substrates in parallel and then jointed to form a bonded chip (a process referred to herein as a "parallel process"). It is noted that x- and y-axes are added in FIG. 1A to further illustrate the spatial relationships of the components of a semiconductor device. A substrate of a semiconductor device, e.g., 3D memory device 100, includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device is determined relative to the substrate of the semiconductor device in the y-direction (the vertical direction or thickness direction) when the substrate is positioned in the lowest plane of the semiconductor device in the y-direction. The same notion for describing the spatial relationships is applied throughout the present disclosure.

3D memory device 100 can include a first semiconductor structure 102 including an array of memory cells (also referred to herein as a "memory cell array"). In some implementations, the memory cell array includes an array of NAND Flash memory cells. For ease of description, a NAND Flash memory cell array may be used as an example for describing the memory cell array in the present disclosure. But it is understood that the memory cell array is not limited to NAND Flash memory cell array and may include any other suitable types of memory cell arrays, such as NOR Flash memory cell array, phase change memory (PCM) cell array, resistive memory cell array, magnetic memory cell array, spin transfer torque (STT) memory cell array, to name a few.

First semiconductor structure 102 can include a NAND Flash memory device in which memory cells are provided in the form of an array of 3D NAND memory strings and/or an array of two-dimensional (2D) NAND memory cells. NAND memory cells can be organized into pages or fingers, which are then organized into blocks in which each NAND memory cell is coupled to a separate line called a bit line (BL). All cells with the same vertical position in the NAND memory cell can be coupled through the control gates by a word line (WL). In some implementations, a memory plane contains a certain number of blocks that are coupled through the same bit line. First semiconductor structure 102 can include one or more memory planes, and the peripheral circuits that are needed to perform all the read/program (write)/erase operations can be included in first semiconductor structure 102 and a second semiconductor structure 104.

In some implementations, the array of NAND memory cells is an array of 2D NAND memory cells, each of which includes a floating-gate transistor. The array of 2D NAND memory cells includes a plurality of 2D NAND memory strings, each of which includes a plurality of memory cells connected in series (resembling a NAND gate) and two select transistors, according to some implementations. Each 2D NAND memory string is arranged in the same plane (i.e., referring to herein a flat, two-dimensional (2D) surface, different from the term "memory plane" in the present discourse) on the substrate, according to some implementations. In some implementations, the array of NAND memory cells is an array of 3D NAND memory strings, each of which extends vertically above the substrate (in 3D) through a stack structure, e.g., a memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

As shown in FIG. 1A, first semiconductor structure 102 can also include at least some of the peripheral circuits of the memory cell array, and 3D memory device 100 can further include a second semiconductor structure 104 each including some of the peripheral circuits of the memory cell array. That is, the peripheral circuits of the memory cell array can be separated into at least two semiconductor structures 102 and 104, and both some peripheral circuits and the memory cell array can be integrated into first semiconductor structure 102. The peripheral circuits (a.k.a. control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first and second semiconductor structures 102 and 104 can use CMOS technology, e.g., which can be implemented with logic processes in any suitable technology nodes.

As shown in FIG. 1A, first and second semiconductor structures 102 and 104 are stacked in different planes, according to some implementations. As a result, the memory cell array and peripheral circuits in first semiconductor structure 102 and the peripheral circuits in second semiconductor structure 104 can be stacked in different planes to reduce the planar size of 3D memory device 100, compared with memory devices in which all the peripheral circuits are disposed in the same plane. As shown in FIG. 1A, 3D memory device 100 further includes a bonding interface 103 vertically between first semiconductor structure 102 and second semiconductor structure 104. Bonding interface 103 can be an interface between two semiconductor structures formed by any suitable bonding technologies as described below in detail, such as hybrid bonding.

As described below in detail, first and second semiconductor structures 102 and 104 can be fabricated separately (and in parallel in some implementations) by the parallel process, such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed across bonding interface 103 to make direct, short-distance (e.g., micron-level) electrical connections between semiconductor structures 102 and 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer among the memory cell array and the different peripheral circuits in different semiconductor structures 102 and 104 can be performed through the interconnects (e.g., bonding contacts) across bonding interface 103. By vertically integrating first and second semiconductor structures 102 and 104, the chip size can be reduced, and the memory cell density can be increased.

Figure 1B:
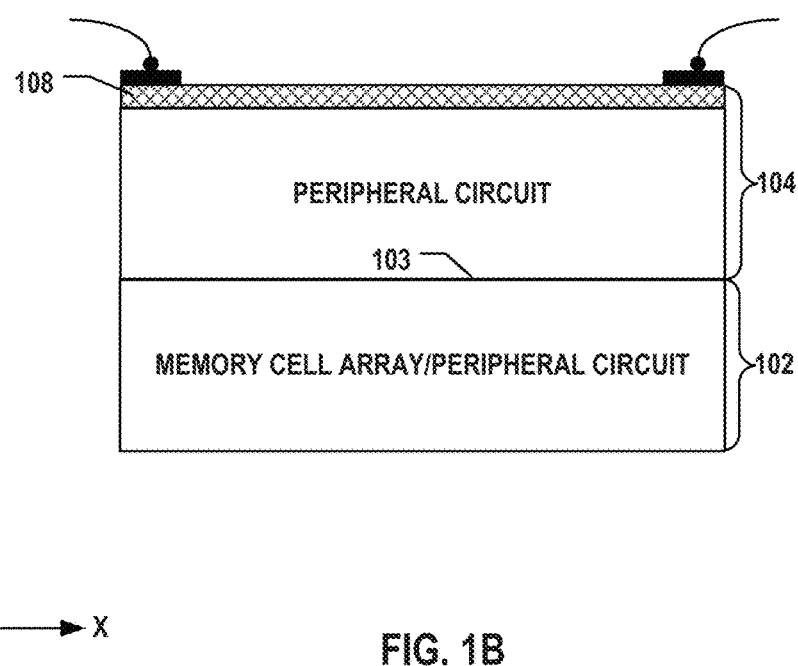
FIG. 1B illustrates a schematic view of a cross-section of another 3D memory device, according to some aspects of the present disclosure.

Moreover, as shown in FIG. 1A, first semiconductor structure 102 of 3D memory device 100 can further include a pad-out interconnect layer 108 for pad-out purposes, i.e., interconnecting with external devices using contact pads on which bonding wires can be soldered. It is understood that in some examples, pad-out interconnect layer 108 may be included in second semiconductor structure 104 that does not include the memory cell array. For example, as shown in FIG. 1B, second semiconductor structure 104 of a 3D memory device 101 may include pad-out interconnect layer 108. That is, pad-out interconnect layer 108 may be arranged on either side of 3D memory device 100 or 101.

Consistent with the scope of the present disclosure, in some implementations, although forming in the same first semiconductor structure 102, the channel structures of the NAND memory strings and the transistors of the peripheral circuits are in contact with different semiconductor layers. For example, the source end of the channel structures may be in contact with a polysilicon layer, such as an N-type doped polysilicon layer, to enable GIDL erase operations, while the transistors may be in contact with a single crystalline silicon layer (e.g., the remainder of a silicon substrate). In some implementations, the different semiconductor layers have a step height, i.e., being nonoverlapping and at least partially noncoplanar, to allow the co-existence of the NAND memory strings and peripheral circuits formed on the same substrate in the same first semiconductor structure 102.

Figure 2:
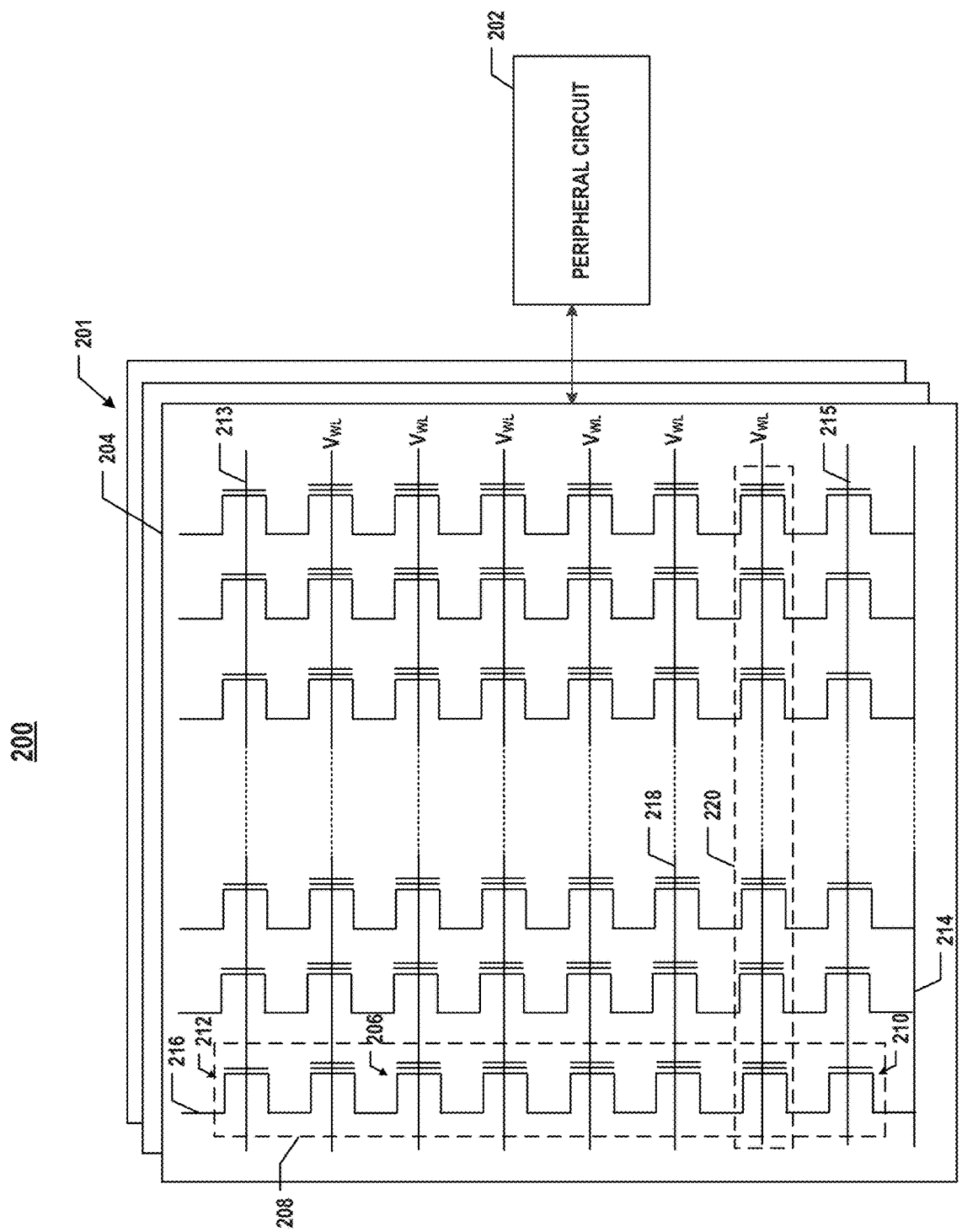
FIG. 2 illustrates a schematic circuit diagram of a memory device including peripheral circuits, according to some aspects of the present disclosure.

FIG. 2 illustrates a schematic circuit diagram of a memory device 200 including peripheral circuits, according to some aspects of the present disclosure. Memory device 200 can include a memory cell array 201 and peripheral circuits 202 coupled to memory cell array 201. 3D memory devices 100 and 101 may be examples of memory device 200 in which memory cell array 201 and a portion of peripheral circuits 202 may be included in first semiconductor structure 102 and a portion of peripheral circuits 202 may be included in second semiconductor structure 104. Memory cell array 201 can be a NAND Flash memory cell array in which memory cells 206 are provided in the form of an array of NAND memory strings 208 each extending vertically above a substrate (not shown). In some implementations, each NAND memory string 208 includes a plurality of memory cells 206 coupled in series and stacked vertically. Each memory cell 206 can hold a continuous, analog value, such as an electrical voltage or charge, that depends on the number of electrons trapped within a region of memory cell 206. Each memory cell 206 can be either a floating gate type of memory cell including a floating-gate transistor or a charge trap type of memory cell including a charge-trap transistor.

In some implementations, each memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 206 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each NAND memory string 208 can include a source select gate (SSG) transistor 210 at its source end and a drain select gate (DSG) transistor 212 at its drain end. SSG transistor 210 and DSG transistor 212 can be configured to activate selected NAND memory strings 208 (columns of the array) during read and program operations. In some implementations, SSG transistors 210 of NAND memory strings 208 in the same block 204 are coupled through a same source line (SL) 214, e.g., a common SL, for example, to the ground. DSG transistor 212 of each NAND memory string 208 is coupled to a respective bit line 216 from which data can be read or programmed via an output bus (not shown), according to some implementations. In some implementations, each NAND memory string 208 is configured to be selected or deselected by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215.

As shown in FIG. 2, NAND memory strings 208 can be organized into multiple blocks 204, each of which can have a common source line 214. In some implementations, each block 204 is the basic data unit for erase operations, i.e., all memory cells 206 on the same block 204 are erased at the same time. Memory cells 206 of adjacent NAND memory strings 208 can be coupled through word lines 218 that select which row of memory cells 206 is affected by read and program operations. In some implementations, each word line 218 is coupled to a page 220 of memory cells 206, which is the basic data unit for program and read operations. The size of one page 220 in bits can correspond to the number of NAND memory strings 208 coupled by word line 218 in one block 204. Each word line 218 can include a plurality of control gates (gate electrodes) at each memory cell 206 in respective page 220 and a gate line coupling the control gates.

Figure 8A:
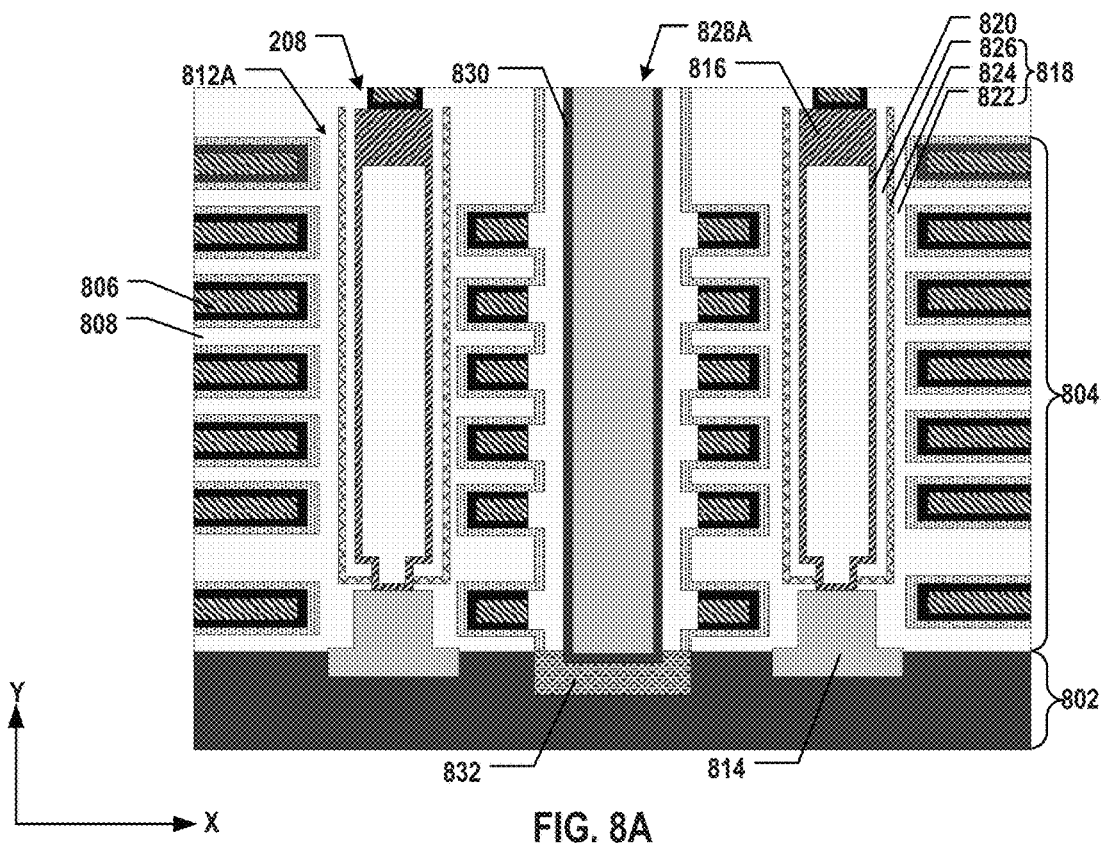
FIGS. 8A-8C illustrate side views of various NAND memory strings in 3D memory devices, according to various aspects of the present disclosure.
Figure 8B:
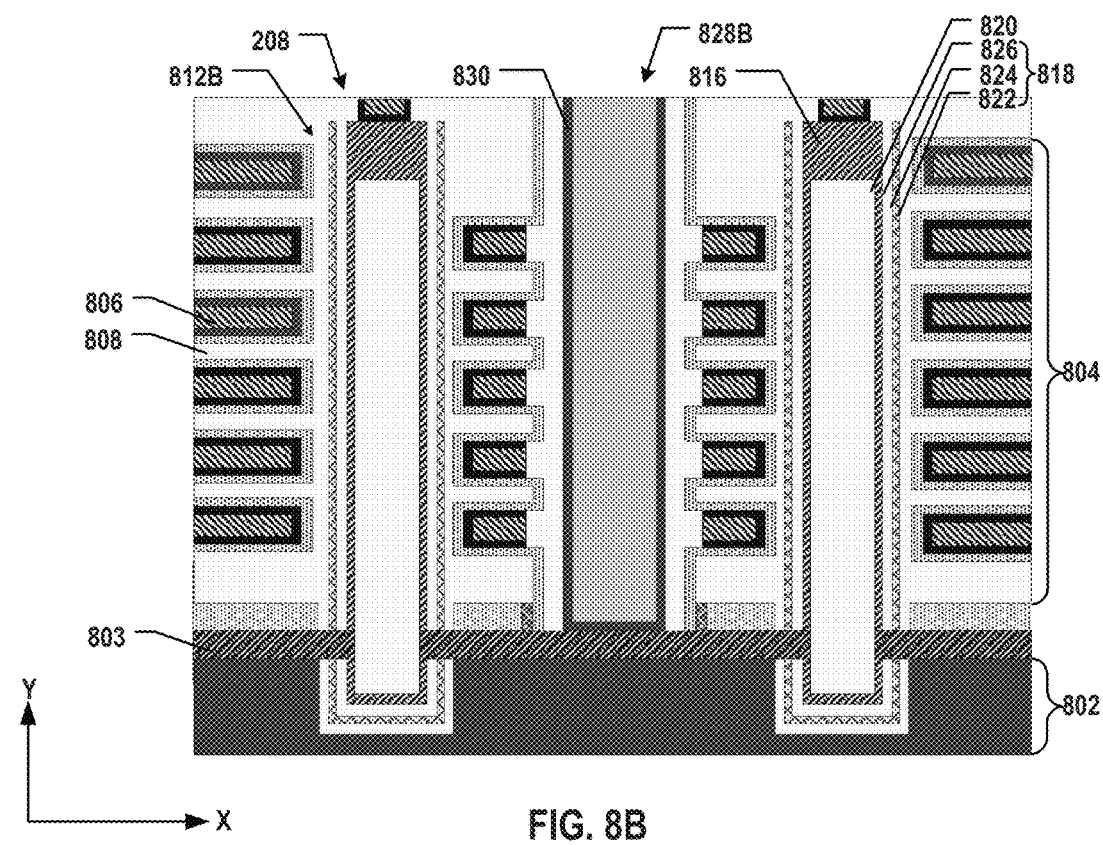
Figure 8C:
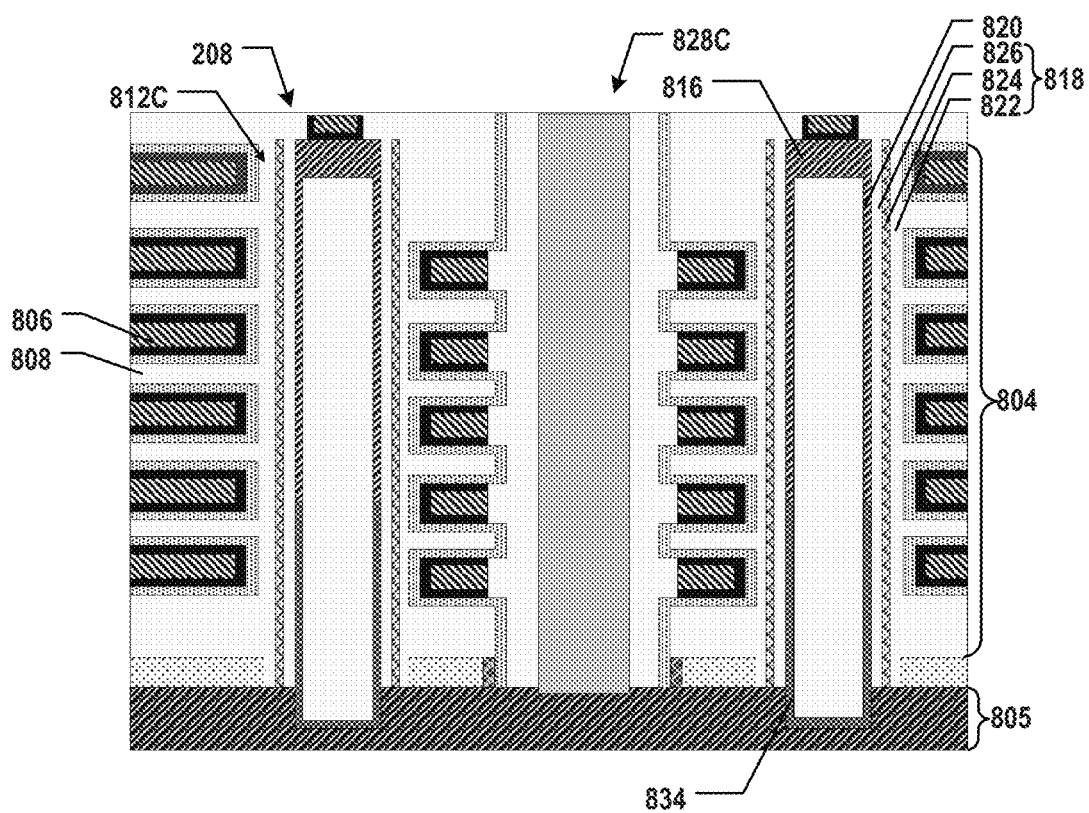

FIGS. 8A-8C illustrate side views of various NAND memory strings 208 in 3D memory devices, according to various aspects of the present disclosure. As shown in FIG. 8A, NAND memory string 208 can extend vertically through a memory stack 804 above a substrate 802. Substrate 802 can be a semiconductor layer including silicon (e.g., single crystalline silicon, c-silicon), silicon germanium (SiGe), gallium arsenide (GaAs), germanium (Ge), silicon on insulator (SOI), germanium on insulator (GOI), or any other suitable semiconductor materials. In some implementations, substrate 802 includes single crystalline silicon.

Memory stack 804 can include interleaved gate conductive layers 806 and dielectric layers 808. The number of the pairs of gate conductive layers 806 and dielectric layers 808 in memory stack 804 can determine the number of memory cells 206 in memory cell array 201. Gate conductive layer 806 can include conductive materials including, but not limited to, tungsten (W), cobalt (Co), copper (Cu), aluminum (Al), polysilicon, doped silicon, silicides, or any combination thereof. In some implementations, each gate conductive layer 806 includes a metal layer, such as a tungsten layer. In some implementations, each gate conductive layer 806 includes a doped polysilicon layer. Each gate conductive layer 806 can include control gates surrounding the memory cells, the gates of DSG transistors 212, or the gates of SSG transistors 210, and can extend laterally as DSG line 213 at the top of memory stack 804, SSG line 215 at the bottom of memory stack 804, or word line 218 between DSG line 213 and SSG line 215.

As shown in FIG. 8A, NAND memory string 208 includes a channel structure 812A extending vertically through memory stack 804. In some implementations, channel structure 812A includes a channel hole filled with semiconductor material(s) (e.g., as a semiconductor channel 820) and dielectric material(s) (e.g., as a memory film 818). In some implementations, semiconductor channel 820 includes silicon, such as polysilicon. In some implementations, memory film 818 is a composite dielectric layer including a tunneling layer 826, a storage layer 824 (also known as a "charge trap/storage layer"), and a blocking layer 822. Channel structure 812A can have a cylinder shape (e.g., a pillar shape). Semiconductor channel 820, tunneling layer 826, storage layer 824, blocking layer 822 are arranged radially from the center toward the outer surface of the pillar in this order, according to some implementations. Tunneling layer 826 can include silicon oxide, silicon oxynitride, or any combination thereof. Storage layer 824 can include silicon nitride, silicon oxynitride, silicon, or any combination thereof. Blocking layer 822 can include silicon oxide, silicon oxynitride, high dielectric constant (high-k) dielectrics, or any combination thereof. In one example, memory film 818 may include a composite layer of silicon oxide/silicon oxynitride/silicon oxide (ONO). Channel structure 812A can further include a channel plug 816 on the drain end of NAND memory string 208. Channel plug 816 can include polysilicon and be in contact with semiconductor channel 820.

As shown in FIG. 8A, NAND memory string 208 can further include a semiconductor plug 814 on the source end thereof, which is in contact with semiconductor channel 820 of channel structure 812A. Semiconductor plug 814, also known as selective epitaxial growth (SEG), can be selectively grown from substrate 802 and thus, has the same material as substrate 802, such as single crystalline silicon. Channel structure 812A in contact with semiconductor plug 814 on the source of NAND memory string 208 (e.g., at the bottom of NAND memory string 208 shown in FIG. 8A, a.k.a. a bottom plug) is referred to herein as a "bottom plug channel structure" 812A.

In some implementations, NAND memory string 208 further include a plurality of control gates (gate electrodes), each of which is part of gate conductive layer 806 close to channel structure 812A. Each gate conductive layer 806 in memory stack 804 can include a part intersecting with channel structure 812 that acts as a control gate for each memory cell of NAND memory string 208.

As shown in FIG. 8A, a slit structure 828A can extend vertically through memory stack 804 and be in contact with substrate 802. Slit structure 828A can include a source contact 830 having conductive materials, such as polysilicon, metals, metal compounds (e.g., titanium nitride (TiN), tantalum nitride (TaN), etc.), or silicides, as well as a well 832 (e.g., a P-well and/or an N-well) in substrate 802. In some implementations, source contact 830 and well 832 of slit structure 828A, part of substrate 802 between slit structure 828A and channel structure 812A, and semiconductor plug 814 function as parts of source line 214 coupled to the source of NAND memory string 208, for example, for applying an erase voltage to the source of NAND memory string 208 during erase operations.

Different from bottom plug channel structure 812A in FIG. 8A, as shown in FIG. 8B, NAND memory string 208 includes a sidewall plug channel structure 812B and is free of semiconductor plug 814 on the source end thereof, according to some implementations. Instead, a sidewall semiconductor layer 803 vertically between substrate 802 and memory stack 804 can be in contact with the sidewall of semiconductor channel 820 of channel structures 812B. Sidewall semiconductor layer 803 can include semiconductor materials, such as polysilicon. Also different from slit structure 828A in FIG. 8A, as shown in FIG. 8B, a slit structure 828B does not include well 832, and source contact 830 of slit structure 828B is in contact with sidewall semiconductor layer 803, according to some implementations. In some implementations, source contact 830 of slit structure 828B and sidewall semiconductor layer 803 collectively function as parts of source line 214 coupled to the source of NAND memory string 208, for example, for applying an erase voltage to the source of NAND memory string 208 during erase operations.

As shown in FIG. 8C, in some implementations, substrate 802 (e.g., having single crystalline silicon) is replaced with a semiconductor layer 805 in contact with semiconductor channel 820 of a bottom open channel structure 812C on the source of NAND memory string 208. Parts of memory film 818 of channel structure 812C on the source end can be removed to expose semiconductor channel 820 to contact semiconductor layer 805. In some implementations, part of semiconductor channel 820 on the source of NAND memory string 208 is doped to form a doped region 834 that is in contact with semiconductor layer 805. Semiconductor layer 805 can include semiconductor materials, such as polysilicon. In some implementations, semiconductor layer 805 includes N-type doped polysilicon, i.e., a polysilicon layer, to enable GIDL erase operations. Also different from slit structures 828A and 828B in FIGS. 8A and 8B, as shown in FIG. 8C, a slit structure 828C does not include source contact 830 and thus, does not function as part of source line 214, according to some implementations. Instead, source contacts (not shown) may be formed on an opposite side of semiconductor layer 805 with respect to channel structure 812C, such that the source contacts and parts of semiconductor layer 805 may function as parts of source line 214 coupled to the source of NAND memory string 208, for example, for applying an erase voltage to the source of NAND memory string 208 during erase operations.

Figure 3:
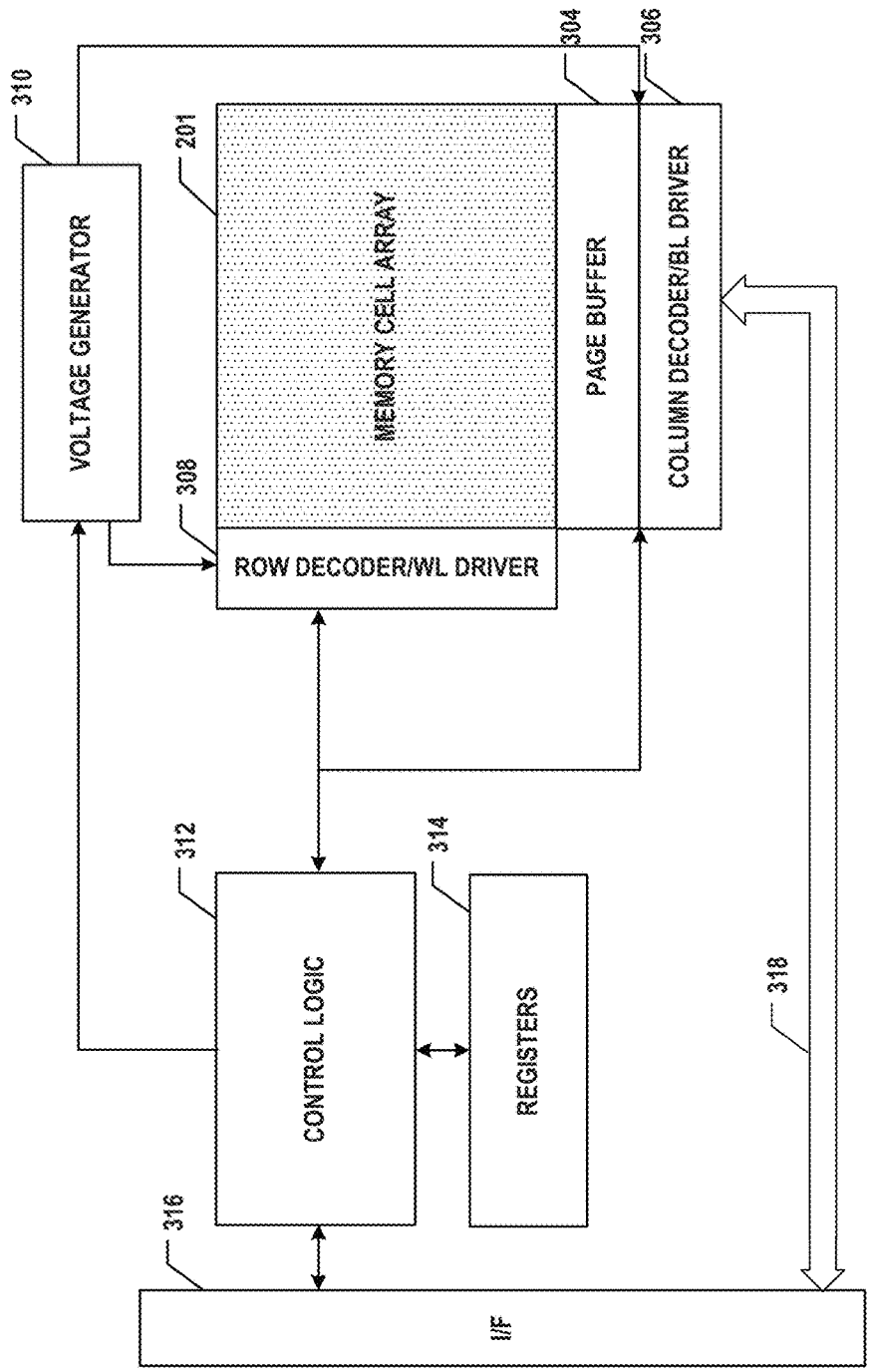
FIG. 3 illustrates a block diagram of a memory device including a memory cell array and peripheral circuits, according to some aspects of the present disclosure.

Referring to FIG. 2, peripheral circuits 202 can be coupled to memory cell array 201 through bit lines 216, word lines 218, source lines 214, SSG lines 215, and DSG lines 213. As described above, peripheral circuits 202 can include any suitable circuits for facilitating the operations of memory cell array 201 by applying and sensing voltage signals and/or current signals through bit lines 216 to and from each target memory cell 206 through word lines 218, source lines 214, SSG lines 215, and DSG lines 213. Peripheral circuits 202 can include various types of peripheral circuits formed using CMOS technologies. For example, FIG. 3 illustrates some exemplary peripheral circuits 202 including a page buffer 304, a column decoder/bit line driver 306, a row decoder/word line driver 308, a voltage generator 310, control logic 312, registers 314, an interface (I/F) 316, and a data bus 318. It is understood that in some examples, additional peripheral circuits 202 may be included as well.

Page buffer 304 can be configured to buffer data read from or programmed to memory cell array 201 according to the control signals of control logic 312. In one example, page buffer 304 may store one page of program data (write data) to be programmed into one page 220 of memory cell array 201. In another example, page buffer 304 also performs program verify operations to ensure that the data has been properly programmed into memory cells 206 coupled to selected word lines 218.

Row decoder/word line driver 308 can be configured to be controlled by control logic 312 and select block 204 of memory cell array 201 and a word line 218 of selected block 204. Row decoder/word line driver 308 can be further configured to drive memory cell array 201. For example, row decoder/word line driver 308 may drive memory cells 206 coupled to the selected word line 218 using a word line voltage generated from voltage generator 310.

Column decoder/bit line driver 306 can be configured to be controlled by control logic 312 and select one or more NAND memory strings 208 by applying bit line voltages generated from voltage generator 310. For example, column decoder/bit line driver 306 may apply column signals for selecting a set of N bits of data from page buffer 304 to be outputted in a read operation.

Control logic 312 can be coupled to each peripheral circuit 202 and configured to control operations of peripheral circuits 202. Registers 314 can be coupled to control logic 312 and include status registers, command registers, and address registers for storing status information, command operation codes (OP codes), and command addresses for controlling the operations of each peripheral circuit 202.

Interface 316 can be coupled to control logic 312 and configured to interface memory cell array 201 with a memory controller (not shown). In some implementations, interface 316 acts as a control buffer to buffer and relay control commands received from the memory controller and/or a host (not shown) to control logic 312 and status information received from control logic 312 to the memory controller and/or the host. Interface 316 can also be coupled to page buffer 304 and column decoder/bit line driver 306 via data bus 318 and act as an I/O interface and a data buffer to buffer and relay the program data received from the memory controller and/or the host to page buffer 304 and the read data from page buffer 304 to the memory controller and/or the host. In some implementations, interface 316 and data bus 318 are parts of an I/O circuit of peripheral circuits 202.

Voltage generator 310 can be configured to be controlled by control logic 312 and generate the word line voltages (e.g., read voltage, program voltage, pass voltage, local voltage, and verification voltage) and the bit line voltages to be supplied to memory cell array 201. In some implementations, voltage generator 310 is part of a voltage source that provides voltages at various levels of different peripheral circuits 202 as described below in detail. In some implementations, the voltages provided by voltage generator 310, for example, to row decoder/word line driver 308, column decoder/bit line driver 306, and page buffer 304 are above certain levels that are sufficient to perform the memory operations. For example, the voltages provided to the page buffer circuits in page buffer 304 and/or the logic circuits in control logic 312 may be between 1.3 V and 5 V, such as 3.3 V, and the voltages provided to the driving circuits in row decoder/word line driver 308 and/or column decoder/bit line driver 306 may be between 5 V and 30 V.

Figure 4A:
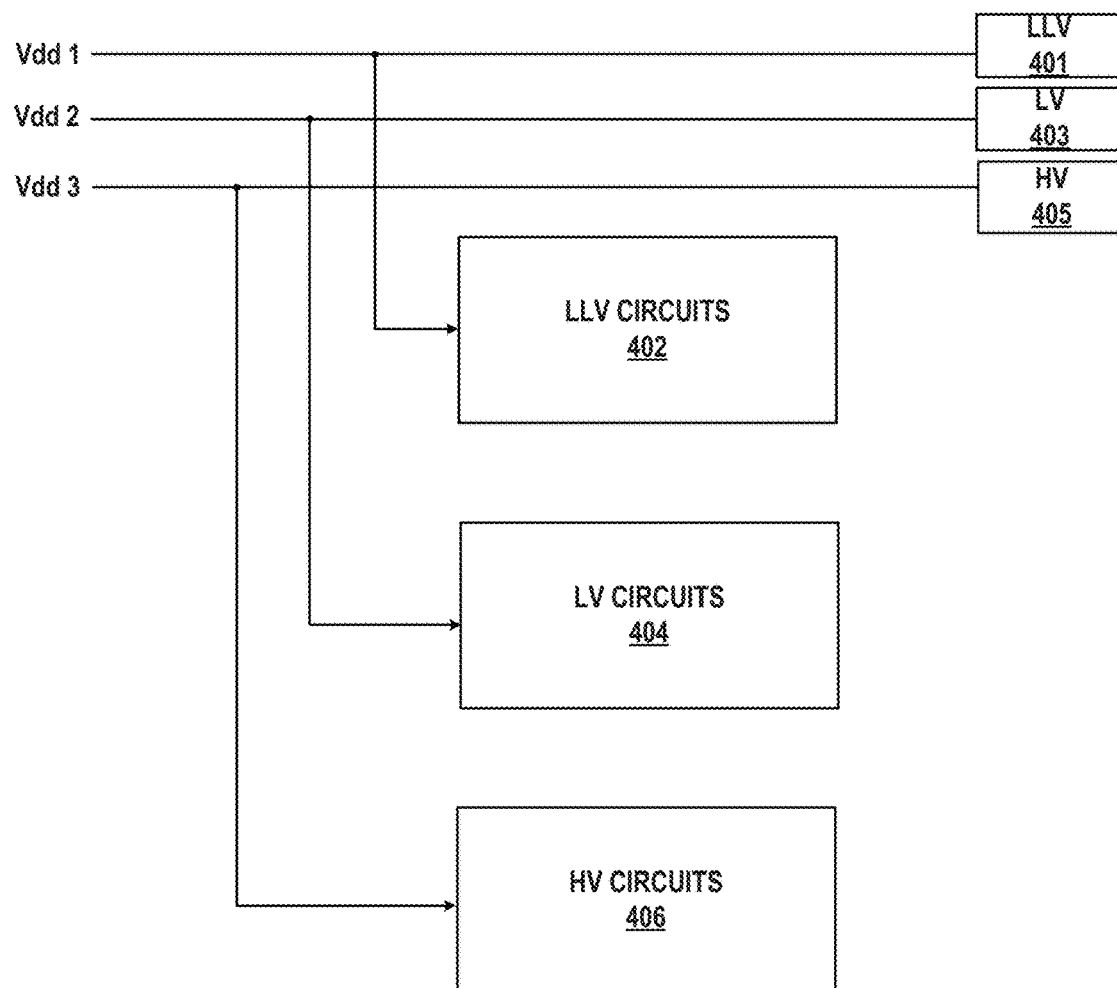
FIG. 4A illustrates a block diagram of peripheral circuits provided with various voltages, according to some aspects of the present disclosure.

Different from logic devices (e.g., microprocessors), memory devices, such as 3D NAND Flash memory, require a wide range of voltages to be supplied to different memory peripheral circuits. For example, FIG. 4A illustrates a block diagram of peripheral circuits provided with various voltages, according to some aspects of the present disclosure. In some implementations, a memory device (e.g., memory device 200) includes a low low voltage (LLV) source 401, a low voltage (LV) source 403, and a high voltage (HV) source 405, each of which is configured to provide a voltage at a respective level (Vdd1, Vdd2, or Vdd3). For example, Vdd3>Vdd2>Vdd1. Each voltage source 401, 403, or 405 can receive a voltage input at a suitable level from an external power source (e.g., a battery). Each voltage source 401, 403, or 405 can also include voltage converters and/or voltage regulators to convert the external voltage input to the respective level (Vdd1, Vdd2, or Vdd3) and maintain and output the voltage at the respective level (Vdd1, Vdd2, or Vdd3) through a corresponding power rail. In some implementations, voltage generator 310 of memory device 200 is part of voltage sources 401, 403, and 405.

In some implementations, LLV source 401 is configured to provide a voltage below 1.3 V, such as between 0.9 V and 1.2 V (e.g., 0.9 V, 0.95 V, 1 V, 1.05 V, 1.1 V, 1.15 V, 1.2 V, any range bounded by the lower end by any of these values, or in any range defined by any two of these values). In one example, the voltage is 1.2 V. In some implementations, LV source 403 is configured to provide a voltage between 1.3 V and 3.3 V (e.g., 1.3 V, 0.1.4 V, 1.5 V, 1.6 V, 1.7 V, 1.8 V, 1.9 V, 2 V, 2.1 V, 2.2 V, 2.3 V, 2.4 V, 2.5 V, 2.6 V, 2.7 V, 2.8 V, 2.9 V, 3 V, 3.1 V, 3.2 V, 3.3 V, any range bounded by the lower end by any of these values, or in any range defined by any two of these values). In one example, the voltage is 3.3 V. In some implementations, HV source 405 is configured to provide a voltage greater than 3.3 V, such as between 5 V and 30 V (e.g., 5 V, 6 V, 7 V, 8 V, 9 V, 10 V, 11 V, 12 V, 13 V, 14 V, 15 V, 16 V, 17 V, 18 V, 19 V, 20 V, 21 V, 22 V, 23 V, 24 V, 25 V, 26 V, 27 V, 28 V, 29 V, 30 V, any range bounded by the lower end by any of these values, or in any range defined by any two of these values). It is understood that the voltage ranges described above with respect to HV source 405, LV source 403, and LLV source 401 are for illustrative purposes and non-limiting, and any other suitable voltage ranges may be provided by HV source 405, LV source 403, and LLV source 401.

Based on their suitable voltage levels (Vdd1, Vdd2, or Vdd3), the memory peripheral circuits (e.g., peripheral circuits 202) can be categorized into LLV circuits 402, LV circuits 404, and HV circuits 406, which can be coupled to LLV source 401, LV source 403, and HV source 405, respectively. In some implementations, HV circuits 406 include one or more driving circuits that are coupled to the memory cell array (e.g., memory cell array 201) through word lines, bit lines, SSG lines, DSG lines, source lines, etc., and configured to drive the memory cell array by applying a voltage at a suitable level to the word lines, bit lines, SSG lines, DSG lines, source lines, etc., when performing memory operations (e.g., read, program, or erase). In one example, HV circuit 406 may include word line driving circuits (e.g., in row decoder/word line driver 308) that are coupled to word lines and apply a program voltage (Vprog) or a pass voltage (Vpass) in the range of, for example, 5 V and 30 V, to the word lines during program operations. In another example, HV circuit 406 may include bit line driving circuits (e.g., in column decoder/bit line driver 306) that are coupled to bit lines and apply an erase voltage (Veras) in the range of, for example, 5 V and 30 V, to bit lines during erase operations. In some implementations, LV circuits 404 include page buffer circuits (e.g., in latches of page buffer 304) and are configured to buffer the data read from or programmed to the memory cell array. For example, the page buffer may be provided with a voltage of, for example, 3.3 V, by LV source 403. LV circuits 404 can also include logic circuits (e.g., in control logic 312). In some implementations, LLV circuits 402 include an I/O circuit (e.g., in interface 316 and/or data bus 318) configured to interface the memory cell array with a memory controller. For example, the I/O circuit may be provided with a voltage of, for example, 1.2 V, by LLV source 401.

Figure 4B:
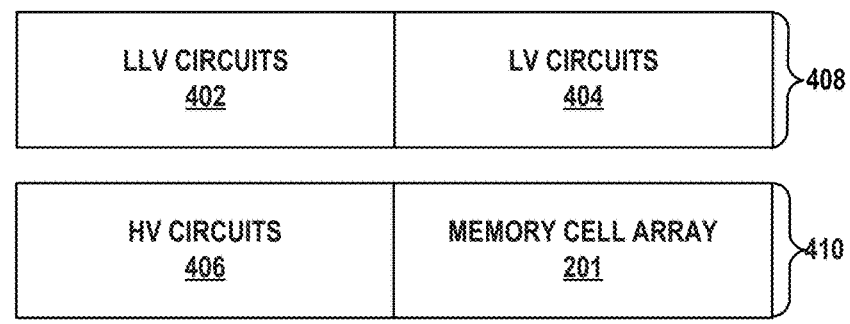
FIG. 4B illustrates a schematic diagram of peripheral circuits provided with various voltages arranged in separate semiconductor structures, according to some aspects of the present disclosure.

As described above, to reduce the total area occupied by the memory peripheral circuits, peripheral circuits 202 can be separately formed in different semiconductor structures based on different performance requirements, such as the applied voltages. For example, FIG. 4B illustrates a schematic diagram of peripheral circuits provided with various voltages arranged in separate semiconductor structures, according to some aspects of the present disclosure. In some implementations, LLV circuits 402/LV circuits 404 and HV circuits 406 are separated, for example, in semiconductor structures 408 and 410, respectively, due to their significant difference in voltages and the resulting difference in device dimensions, such as different semiconductor layer (e.g., substrate or thinned substrate) thicknesses and different gate dielectric thicknesses. In one example, the thickness of the semiconductor layer (e.g., a substrate or a thinned substrate) in which HV circuits 406 are formed in semiconductor structure 410 may be larger than the thickness of the semiconductor layer (e.g., a substrate or a thinned substrate) in which LLV circuits 402/LV circuits 404 are formed in semiconductor structure 408. In another example, the thickness of the gate dielectric of transistors forming HV circuits 406 may be larger than the thickness of the gate dielectric of transistors forming LLV circuits 402/LV circuits 404. For example, the thickness difference may be at least 5-fold. It is understood that stacked LLV circuits 402/LV circuits 404 and HV circuits 406 in different planes may be formed in two semiconductor structure 408 or 410 separated by bonding interface (e.g., in FIGS. 1A and 1B).

In some implementations, LLV circuits 402/LV circuits 404 and HV circuits 406 are separated, for example, in semiconductor structures 408 and 410, respectively, due to their significant difference in thermal budget and the resulting difference in their materials, such as different source/drain contact materials for reducing contact resistance and different interconnect materials. In one example, LLV circuits 402/LV circuits 404 may use nickel silicide (NiSi) as the material of source/drain contact, which has a higher conductivity but lower thermal budget (e.g., a lower melting point) than tungsten silicide (WSi) used as the material of source/drain contact for HV circuits 406. In another example, copper (Cu) may be used as the interconnect material for HV circuits 406, which has a higher conductivity but lower thermal budget (e.g., a lower melting point) than tungsten (W) used as the interconnect material for HV circuits 406. In some implementations, memory cell array 201 is disposed in semiconductor structure 410 with HV circuits 406 because of the higher process compatibility with HV circuits 406 than with LLV circuits 402/LV circuits 404. For example, the process for forming NAND memory strings 208 may have a thermal budget that is higher than the thermal budget for forming LLV circuits 402/LV circuits 404 but is suitable for forming HV circuits 406. It is understood that in some examples, LLV circuits 402 and/or LV circuits 404 may be disposed in semiconductor structure 410 with memory cell array 201, i.e., replacing HV circuits 406. For example, WSi may be used as the material of source/drain contact for LLV circuits 402 and/or LV circuits 404, and W may be used as the interconnect material for LLV circuits 402 and/or LV circuits 404 to increase the thermal budget of LLV circuits 402 and/or LV circuits 404 to be compatible with memory cell array 201 in the same semiconductor structure 410.

Figure 7:
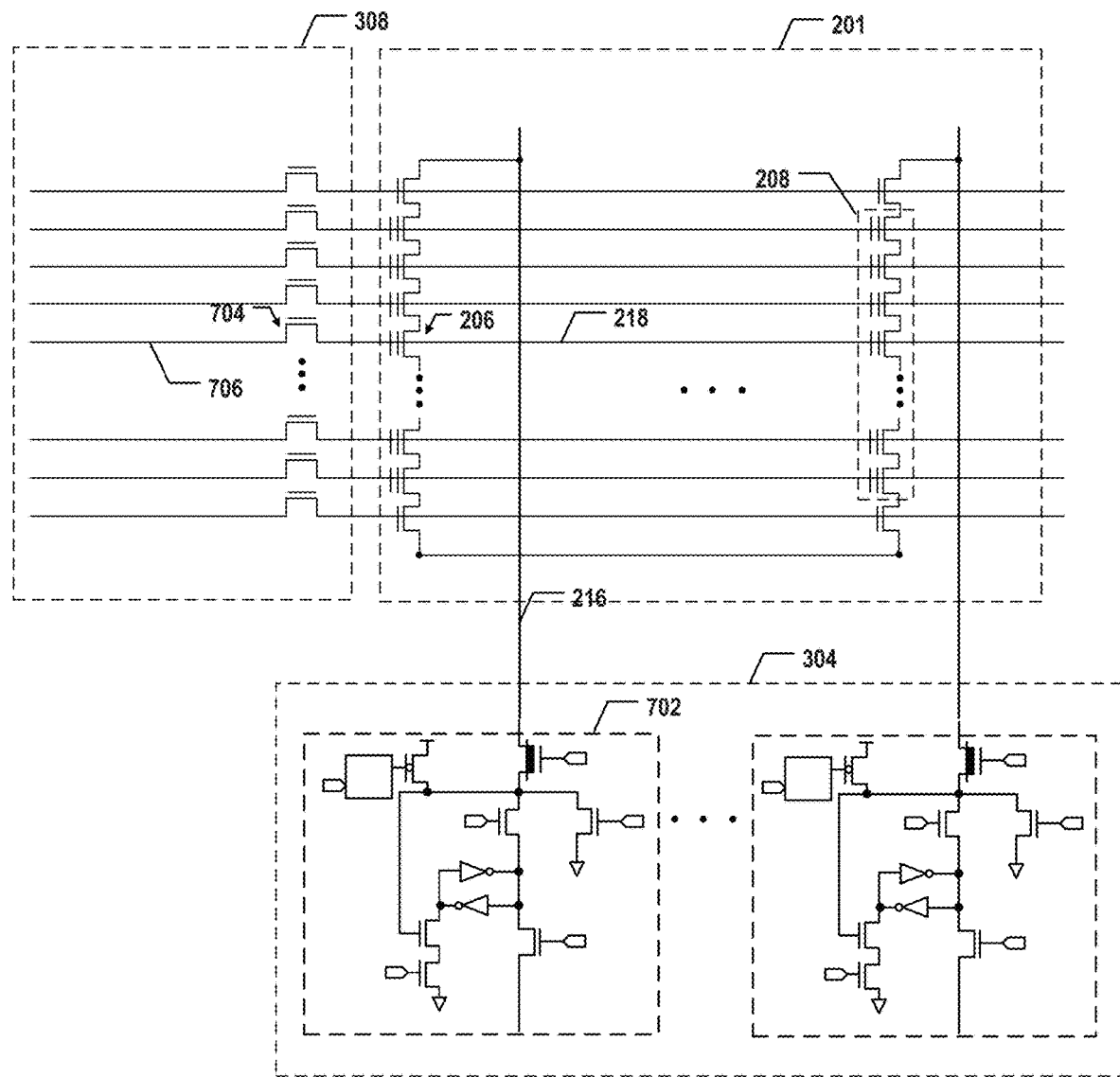
FIG. 7 illustrates a circuit diagram of a word line driver and a page buffer, according to some aspects of the present disclosure.

Based on the different performance requirements (e.g., associated with different applied voltages), peripheral circuits 202 can be separated into at least two stacked semiconductor structures 408 and 410 in different planes. In some implementations, the I/O circuits in interface 316 and/or data bus 318 (as LLV circuits 402), and logic circuits in control logic 312 and page buffer circuits in page buffer 304 (as LV circuits 404) are disposed in semiconductor structure 408, while driving circuits in row decoder/word line driver 308 and column decoder/bit line driver 306 are disposed in semiconductor structure 410. For example, FIG. 7 illustrates a circuit diagram of word line driver 308 and page buffer 304, according to some aspects of the present disclosure.

In some implementations, page buffer 304 includes a plurality of page buffer circuits 702 each coupled to one NAND memory string 208 via a respective bit line 216. That is, memory device 200 can include bit lines 216 respectively coupled to NAND memory strings 208, and page buffer 304 can include page buffer circuits 702 respectively coupled to bit lines 216 and NAND memory strings 208. Each page buffer circuit 702 can include one or more latches, switches, supplies, nodes (e.g., data nodes and I/O nodes), current mirrors, verify logic, sense circuits, etc. In some implementations, each page buffer circuit 702 is configured to store sensing data corresponding to read data, which is received from a respective bit line 216, and output the stored sensing data to at the time of the read operation; each page buffer circuit 702 is also configured to store program data and output the stored program data to a respective bit line 216 at the time of the program operation. In some implementations, page buffer circuits 702 include parts of LV circuits 404 disposed in semiconductor structure 408.

In some implementations, word line driver 308 includes a plurality of string drivers 704 (a.k.a. driving circuits) respectively coupled to word lines 218. Word line driver 308 can also include a plurality of local word lines 706 (LWLs)

respectively coupled to string drivers 704. Each string driver 704 can include a gate coupled to a decoder (not shown), a source/drain coupled to a respective local word line 706, and another source/drain coupled to a respective word line 218. In some memory operations, the decoder can select certain string drivers 704, for example, by applying a voltage signal greater than the threshold voltage of string drivers 704, and a voltage (e.g., program voltage, pass voltage, or erase voltage) to each local word line 706, such that the voltage is applied by each selected string driver 704 to a respective word line 218. In contrast, the decoder can also deselect certain string drivers 704, for example, by applying a voltage signal smaller than the threshold voltage of string drivers 704, such that each deselected string driver 704 floats a respective word line 218 during the memory operation. In some implementations, string drivers 704 include parts of HV circuits 406 disposed in semiconductor structure 410.

Figure 5A:
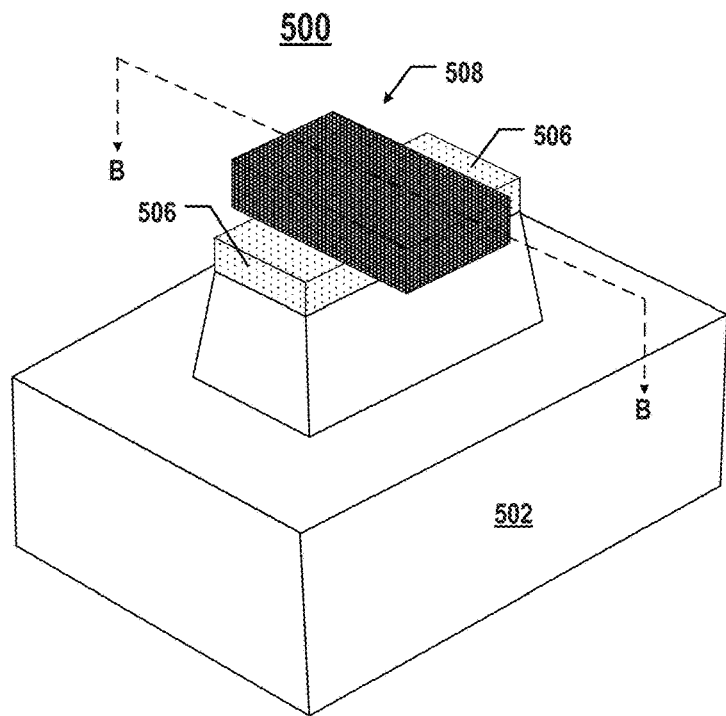
FIGS. 5A and 5B illustrate a perspective view and a side view, respectively, of a planar transistor, according to some aspects of the present disclosure.
Figure 5B:
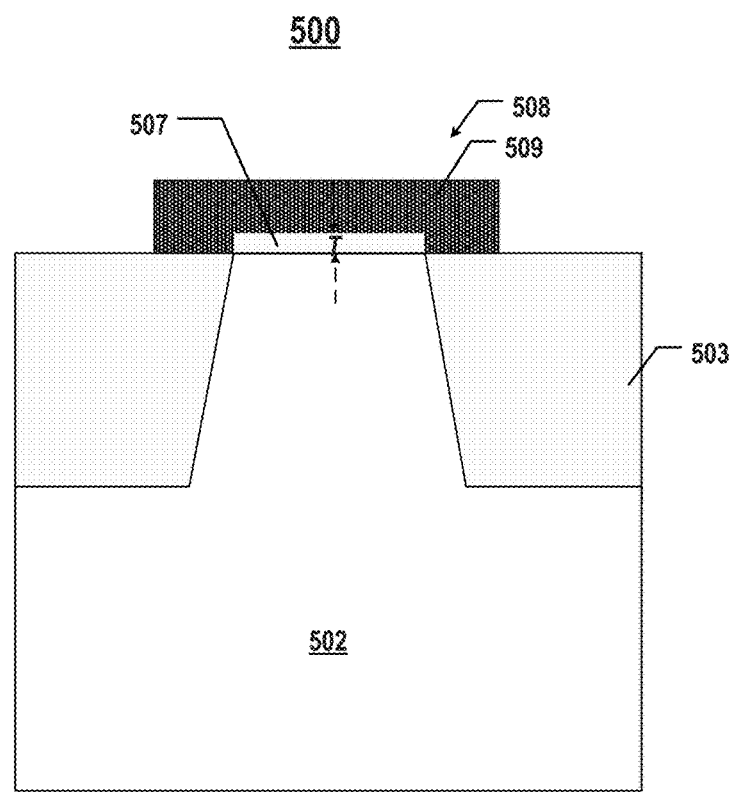
Figure 6A:
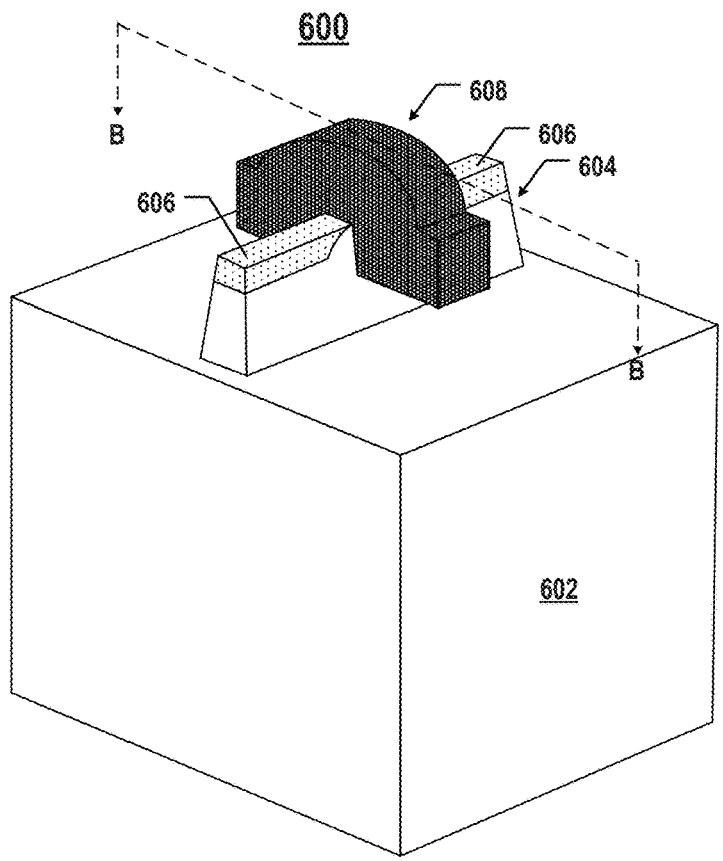
FIGS. 6A and 6B illustrate a perspective view and a side view, respectively, of a 3D transistor, according to some aspects of the present disclosure.
Figure 6B:
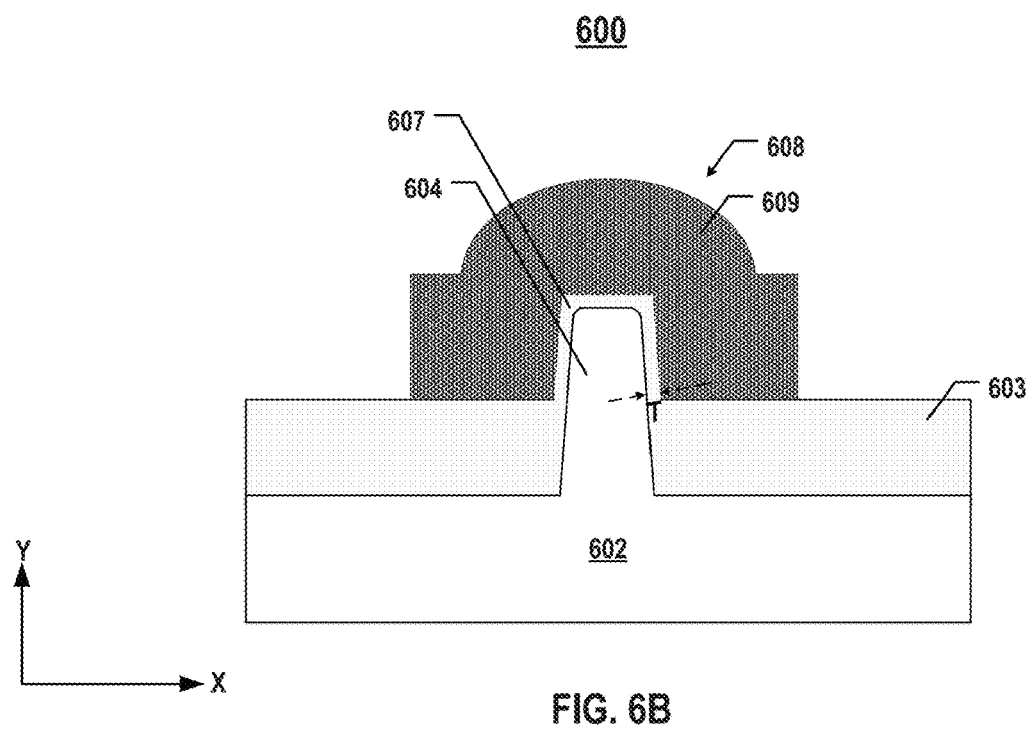

Consistent with the scope of the present disclosure, each peripheral circuit 202 can include a plurality of transistors as the basic building units thereof. The transistors can be metal-oxide-semiconductor field-effect-transistors (MOSFETs) in 2D (2D transistors, a.k.a. planar transistors) or 3D (3D transistors). For example, FIGS. 5A and 5B illustrate a perspective view and a side view, respectively, of a planar transistor 500, according to some aspects of the present disclosure, and FIGS. 6A and 6B illustrate a perspective view and a side view, respectively, of a 3D transistor 600, according to some aspects of the present disclosure. FIG. 5B illustrates the side view of the cross-section of planar transistor 500 in FIG. 5A in the BB plane, and FIG. 6B illustrates the side view of the cross-section of 3D transistor 600 in FIG. 6A in the BB plane.

As shown in FIGS. 5A and 5B, planar transistor 500 can be a MOSFET on a substrate 502, which can include silicon (e.g., single crystalline silicon, c-Si), SiGe, GaA), Ge, SOI, or any other suitable materials. Trench isolations 503, such as shallow trench isolations (STI), can be formed in substrate 502 and between adjacent planar transistors 500 to reduce current leakage. Trench isolations 503 can include any suitable dielectric materials, such as silicon oxide, silicon nitride, silicon oxynitride, or high dielectric constant (high-k) dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, trench isolation 503 includes silicon oxide.

As shown in FIGS. 5A and 5B, planar transistor 500 can also include a gate structure 508 on substrate 502. In some implementations, gate structure 508 is on the top surface of substrate 502. As shown in FIG. 5B, gate structure 508 can include a gate dielectric 507 on substrate 502, i.e., above and in contact with the top surface of substrate 502. Gate structure 508 can also include a gate electrode 509 on gate dielectric 507, i.e., above and in contact with gate dielectric 507. Gate dielectric 507 can include any suitable dielectric materials, such as silicon oxide, silicon nitride, silicon oxynitride, or high-k dielectrics. In some implementations, gate dielectric 507 includes silicon oxide, i.e., a gate oxide. Gate electrode 509 can include any suitable conductive materials, such as polysilicon, metals (e.g., W, Cu, Al, etc.), metal compounds (e.g., TiN, TaN, etc.), or silicides. In some implementations, gate electrode 509 includes doped polysilicon, i.e., a gate poly.

As shown in FIG. 5A, planar transistor 500 can further include a pair of a source and a drain 506 in substrate 502. Source and drain 506 can be doped with any suitable P-type dopants, such as boron (B) or Gallium (Ga), or any suitable N-type dopants, such as phosphorus (P) or arsenic (As). Source and drain 506 can be separated by gate structure 508 in the plan view. In other words, gate structure 508 is formed between source and drain 506 in the plan view, according to some implementations. The channel of planar transistor 500 in substrate 502 can be formed laterally between source and drain 506 under gate structure 508 when a gate voltage applied to gate electrode 509 of gate structure 508 is above the threshold voltage of planar transistor 500. As shown in FIGS. 5A and 5B, gate structure 508 can be above and in contact with the top surface of the part of substrate 502 in which the channel can be formed (the active region). That is, gate structure 508 is in contact with only one side of the active region, i.e., in the plane of the top surface of substrate 502, according to some implementations. It is understood, although not shown in FIGS. 5A and 5B, planar transistor 500 may include additional components, such as wells and spacers.

As shown in FIGS. 6A and 6B, 3D transistor 600 can be a MOSFET on a substrate 602, which can include silicon (e.g., single crystalline silicon, c-Si), SiGe, GaAs, Ge, silicon on insulator SOI, or any other suitable materials. In some implementations, substrate 602 includes single crystalline silicon. Trench isolations 603, such as STI, can be formed in substrate 602 and between adjacent 3D transistors 600 to reduce current leakage. Trench isolations 603 can include any suitable dielectric materials, such as silicon oxide, silicon nitride, silicon oxynitride, or high-k dielectrics (e.g., aluminum oxide, hafnium oxide, zirconium oxide, etc.). In some implementations, trench isolation 603 includes silicon oxide.

As shown in FIGS. 6A and 6B, different from planar transistor 500, 3D transistor 600 can further include a 3D semiconductor body 604 above substrate 602. That is, in some implementations, 3D semiconductor body 604 at least partially extends above the top surface of substrate 602 to expose not only the top surface, but also the two side surfaces, of 3D semiconductor body 604. As shown in FIGS. 6A and 6B, for example, 3D semiconductor body 604 may be in a 3D structure, which is also known as a "fin," to expose three sides thereof. 3D semiconductor body 604 is formed from substrate 602 and thus, has the same semiconductor material as substrate 602, according to some implementations. In some implementations, 3D semiconductor body 604 includes single crystalline silicon. Since the channels can be formed in 3D semiconductor body 604, as opposed to substrate 602, 3D semiconductor body 604 may be viewed as the active region for 3D transistor 600.

As shown in FIGS. 6A and 6B, 3D transistor 600 can also include a gate structure 608 on substrate 602. Different from planar transistors 500 in which gate structure 508 is in contact with only one side of the active region, i.e., in the plane of the top surface of substrate 502, gate structure 608 of 3D transistor 600 can be in contact with a plurality of sides of the active region, i.e., in multiple planes of the top surface and side surfaces of the 3D semiconductor body 604. In other words, the active region of 3D transistor 600, i.e., 3D semiconductor body 604, can be at least partially surrounded by gate structure 608.

Gate structure 608 can include a gate dielectric 607 over 3D semiconductor body 604, e.g., in contact with the top surface and two side surfaces of 3D semiconductor body 604. Gate structure 608 can also include a gate electrode 609 over and in contact with gate dielectric 607. Gate dielectric 607 can include any suitable dielectric materials, such as silicon oxide, silicon nitride, silicon oxynitride, or high-k dielectrics. In some implementations, gate dielectric 607 includes silicon oxide, i.e., a gate oxide. Gate electrode 609 can include any suitable conductive materials, such as polysilicon, metals (e.g., W, Cu, Al, etc.), metal compounds (e.g., TiN, TaN, etc.), or silicides. In some implementations, gate electrode 609 includes doped polysilicon, i.e., a gate poly.

As shown in FIG. 6A, 3D transistor 600 can further include a pair of a source and a drain 606 in 3D semiconductor body 604. Source and drain 606 can be doped with any suitable P-type dopants, such as B or Ga, or any suitable N-type dopants, such as P or Ar. Source and drain 606 can be separated by gate structure 608 in the plan view. In other words, gate structure 608 is formed between source and drain 606 in the plan view, according to some implementations. As a result, multiple channels of 3D transistor 600 in 3D semiconductor body 604 can be formed laterally between source and drain 606 surrounded by gate structure 608 when a gate voltage applied to gate electrode 609 of gate structure 608 is above the threshold voltage of 3D transistor 600. Different from planar transistor 500 in which only a single channel can be formed on the top surface of substrate 502, multiple channels can be formed on the top surface and side surfaces of 3D semiconductor body 604 in 3D transistor 600. In some implementations, 3D transistor 600 includes a multi-gate transistor. It is understood, although not shown in FIGS. 6A, and 6B, 3D transistor 600 may include additional components, such as wells, spacers, and stressors (a.k.a. strain elements) at source and drain 606.

It is further understood that FIGS. 6A and 6B illustrate one example of 3D transistors that can be used in memory peripheral circuits, and any other suitable 3D multi-gate transistors may be used in memory peripheral circuits as well, including, for example, a gate all around (GAA) silicon on nothing (SON) transistor, a multiple independent gate FET (MIGET), a trigate FET, a Π-gate FET, and a Ω-FET, a quadruple gate FET, a cylindrical FET, or a multi-bridge/stacked nanowire FET.

Regardless of planar transistor 500 or 3D transistor 600, each transistor of a memory peripheral circuit can include a gate dielectric (e.g., gate dielectrics 507 and 607) having a thickness T (gate dielectric thickness, e.g., shown in FIGS. 5B and 6B). The gate dielectric thickness T of a transistor can be designed to accommodate the voltage applied to the transistor. For example, referring to FIGS. 4A and 4B, the gate dielectric thickness of transistors in HV circuits 406 (e.g., driving circuits such as string drivers 704) may be larger than the gate dielectric thickness of transistors in LV circuits 404 (e.g., page buffer circuits 702 or logic circuits in control logic 312) and the gate dielectric thickness of transistors LLV circuits 402 (e.g., I/O circuits in interface 316 and data bus 318). In some implementations, the difference between the gate dielectric thickness of transistors in HV circuits 406 and the dielectric thickness of transistors in LV circuits 404/LLV circuits 402 is at least 5-fold, such as between 5-fold and 50-fold. For example, the gate dielectric thickness of transistors in HV circuits 406 may be at least 5 times larger than the gate dielectric thickness of transistors in LV circuits 404/LLV circuits 402.

In some implementations, the dielectric thickness of transistors in LLV circuits 402 is between 2 nm and 4 nm (e.g., 2 nm, 2.1 nm, 2.2 nm, 2.3 nm, 2.4 nm, 2.5 nm, 2.6 nm, 2.7 nm, 2.8 nm, 2.9 nm, 3 nm, 3.1 nm, 3.2 nm, 3.3 nm, 3.4 nm, 3.5 nm, 3.6 nm, 3.7 nm, 3.8 nm, 3.9 nm, 4 nm, any range bounded by the lower end by any of these values, or in any range defined by any two of these values). It is understood that the thickness may be commensurate with the LLV voltage range applied to LLV circuits 402, as described above in detail, such as below 1.3 V (e.g., 1.2 V). In some implementations, the dielectric thickness of transistors in LV circuits 404 is between 4 nm and 10 nm (e.g., 4 nm, 4.5 nm, 5 nm, 5.5 nm, 6 nm, 6.5 nm, 7 nm, 7.5 nm, 8 nm, 8.5 nm, 9 nm. 9.5 nm, 10 nm, any range bounded by the lower end by any of these values, or in any range defined by any two of these values). It is understood that the thickness may be commensurate with the LV voltage range applied to LV circuits 404, as described above in detail, such as between 1.3 V and 3.3 V (e.g., 3.3 V). In some implementations, the dielectric thickness of transistors in HV circuits 406 is between 20 nm and 100 nm (e.g., 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 45 nm, 50 nm, 55 nm, 60 nm, 65 nm, 70 nm, 75 nm, 80 nm, 85 nm, 90 nm, 95 nm, 100 nm, any range bounded by the lower end by any of these values, or in any range defined by any two of these values). It is understood that the thickness may be commensurate with the HV voltage range applied to HV circuits 406, as described above in detail, such as greater than 3.3 V (e.g., between 5 V and 30 V).

Regardless of planar transistor 500 or 3D transistor 600, each transistor of a memory peripheral circuit can include source/drain contacts (not shown) in contact with source/drain (e.g., source/drain 506 and 606). In some implementations, the material of the source/drain contacts of transistors in HV circuits 406 includes WSi, and the material of the source/drain contacts of transistors in LV circuits 404/LLV circuits 402 includes NiSi.

Figure 9A:
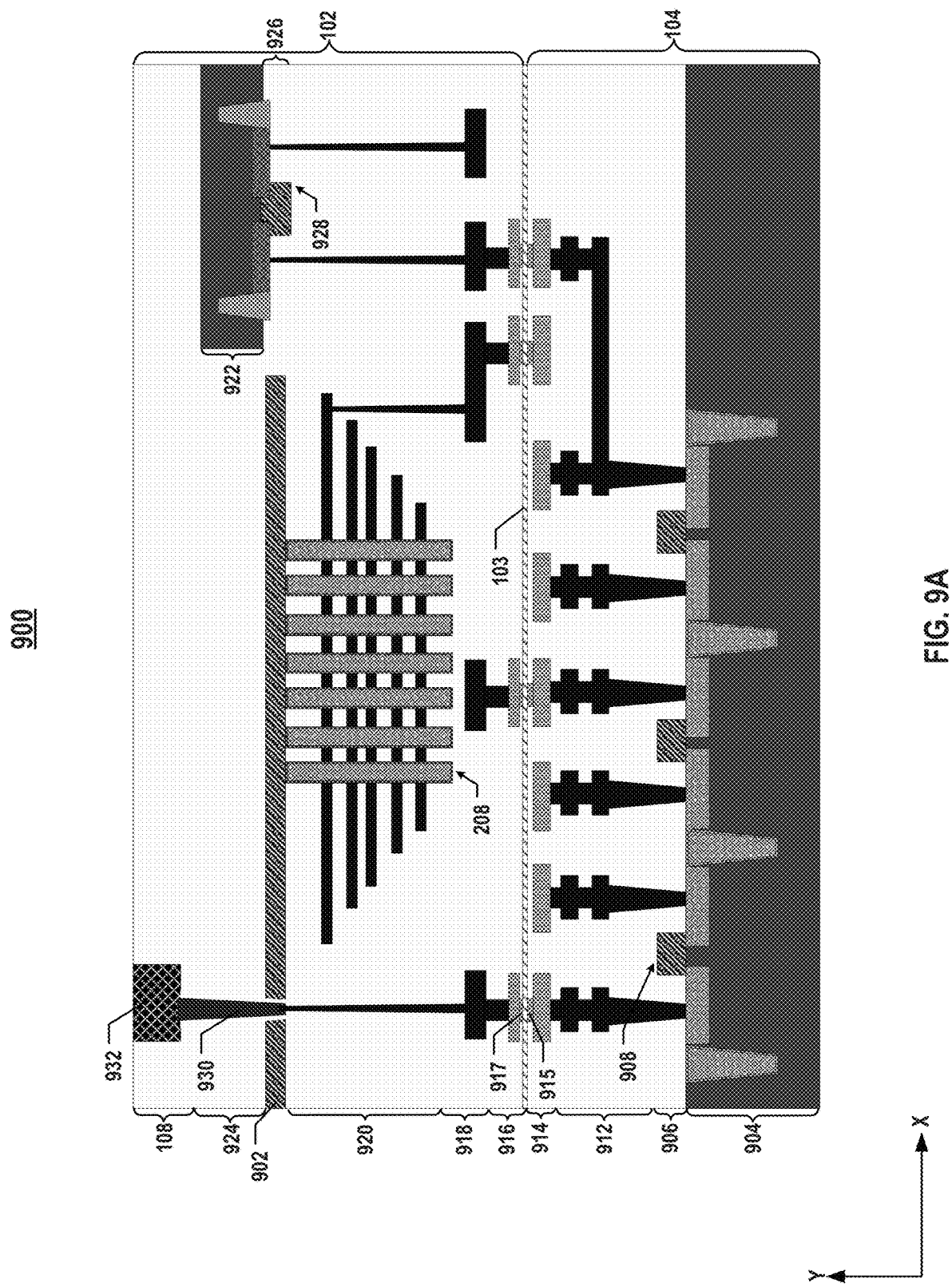
FIGS. 9A-9D illustrate side views of various examples of the 3D memory devices in FIGS. 1A and 1B, according to various aspects of the present disclosure.

FIGS. 9A-9D illustrate side views of various examples of 3D memory devices 100 and 101 in FIGS. 1A and 1B, according to various aspects of the present disclosure. It is understood that FIGS. 9A-9D are for illustrative purposes only and may not necessarily reflect the actual device structure (e.g., interconnections) in practice. As shown in FIG. 9A, as one example of 3D memory device 100 in FIG. 1A, 3D memory device 900 is a bonded chip including first semiconductor structure 102 and second semiconductor structure 104, which are stacked over one another in different planes in the vertical direction (e.g., the y-direction in FIG. 9A), according to some implementations. First and second semiconductor structures 102 and 104 are bonded at bonding interface 103 therebetween, according to some implementations.

As shown in FIG. 9A, second semiconductor structure 104 can include a semiconductor layer 904 having semiconductor materials. In some implementations, semiconductor layer 904 is a silicon substrate having single crystalline silicon. Second semiconductor structure 104 can also include peripheral circuits 906 above and in contact with semiconductor layer 904. In some implementations, peripheral circuits 906 include LV circuits, such as page buffer circuits (e.g., page buffer circuits 702 in page buffer 304) and logic circuits (e.g., in control logic 312), as well as LLV circuits, such as I/O circuits (e.g., in interface 316 and data bus 318). It is understood that in some examples, peripheral circuits 906 may further include HV circuits, such as driving circuits (e.g., string drivers 704 in row decoder/word line driver 308 and drivers in column decoder/bit line driver 306). It is also understood that in some examples, peripheral circuits 906 may include only LV circuits, only LLV circuits, or only HV circuits. In some implementations, peripheral circuits 906 include a plurality of transistors 908 in contact with semiconductor layer 904. Transistors 908 can include any transistors disclosed herein, such as planar transistors 500 and 3D transistors 600. As described above in detail with respect to transistors 500 and 600, in some implementations, each transistor 908 includes a gate dielectric. Trench isolations (e.g., STIs) and doped regions (e.g., wells, sources, and drains of transistors 908) can be formed on or in semiconductor layer 904 as well.

In some implementations, second semiconductor structure 104 further includes an interconnect layer 912 above peripheral circuits 906 to transfer electrical signals to and from peripheral circuits 906. As shown in FIG. 9A, interconnect layer 912 can be vertically between bonding interface 103 and peripheral circuits 906 (including transistors 908). Interconnect layer 912 can include a plurality of interconnects (also referred to herein as "contacts"), including lateral lines and vias. As used herein, the term "interconnects" can broadly include any suitable types of interconnects, such as middle-end-of-line (MEOL) interconnects and back-end-of-line (BEOL) interconnects. The interconnects in interconnect layer 912 can be coupled to transistors 908 of peripheral circuits 906. Interconnect layer 912 can further include one or more interlayer dielectric (ILD) layers (also known as "intermetal dielectric (IMD) layers") in which the lateral lines and vias can form. That is, interconnect layer 912 can include lateral lines and vias in multiple ILD layers. In some implementations, peripheral circuits 906 are coupled to one another through the interconnects in interconnect layer 912. For example, LV circuits may be coupled to LLV circuits through interconnect layer 912. The interconnects in interconnect layer 912 can include conductive materials including, but not limited to, W, Co, Cu, Al, silicides, or any combination thereof. The ILD layers in interconnect layer 912 can include dielectric materials including, but not limited to, silicon oxide, silicon nitride, silicon oxynitride, low dielectric constant (low-k) dielectrics, or any combination thereof.

In some implementations, the interconnects in interconnect layer 912 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 912 can occur after the high-temperature processes in forming peripheral circuits 906 in second semiconductor structure 104, as well as being separated from the high-temperature processes in forming first semiconductor structure 102, the interconnects of interconnect layer 912 having Cu can become feasible.

As shown in FIG. 9A, second semiconductor structure 104 can further include a bonding layer 914 at bonding interface 103 and above and in contact with interconnect layer 912. Bonding layer 914 can include a plurality of bonding contacts 915 and dielectrics electrically isolating bonding contacts 915. Bonding contacts 915 can include conductive materials including, but not limited to, W, Co, Cu, Al, silicides, or any combination thereof. In some implementations, bonding contacts 915 of bonding layer 914 include Cu. The remaining area of bonding layer 914 can be formed with dielectrics including, but not limited to, silicon oxide, silicon nitride, silicon oxynitride, low-k dielectrics, or any combination thereof. Bonding contacts 915 and surrounding dielectrics in bonding layer 914 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 9A, first semiconductor structure 102 can also include a bonding layer 916 at bonding interface 103, e.g., on the opposite side of bonding interface 103 with respect to bonding layer 914 in second semiconductor structure 104. Bonding layer 916 can include a plurality of bonding contacts 917 and dielectrics electrically isolating bonding contacts 917. Bonding contacts 917 can include conductive materials, such as Cu. The remaining area of bonding layer 916 can be formed with dielectric materials, such as silicon oxide. Bonding contacts 917 and surrounding dielectrics in bonding layer 916 can be used for hybrid bonding. In some implementations, bonding interface 103 is the place at which bonding layers 914 and 916 are met and bonded. In practice, bonding interface 103 can be a layer with a certain thickness that includes the top surface of bonding layer 914 of second semiconductor structure 104 and the bottom surface of bonding layer 916 of first semiconductor structure 102.

As shown in FIG. 9A, first semiconductor structure 102 can further include an interconnect layer 918 above bonding layer 916 to transfer electrical signals. Interconnect layer 918 can include a plurality of interconnects, such as MEOL interconnects and BEOL interconnects. In some implementations, the interconnects in interconnect layer 918 also include local interconnects, such as bit line contacts and word line contacts. Interconnect layer 918 can further include one or more ILD layers in which the lateral lines and vias can form. The interconnects in interconnect layer 918 can include conductive materials including, but not limited to, W, Co, Cu, Al, silicides, or any combination thereof. The ILD layers in interconnect layer 918 can include dielectric materials including, but not limited to, silicon oxide, silicon nitride, silicon oxynitride, low-k dielectrics, or any combination thereof. In some implementations, the interconnects in interconnect layer 918 include W, which has a relatively high thermal budget (compatible with high-temperature processes) and good quality (fewer detects, e.g., voids) among conductive metal materials.

As shown in FIG. 9A, first semiconductor structure 102 can include a memory cell array, such as an array of NAND memory strings 208 above interconnect layer 918. In some implementations, interconnect layer 918 is vertically between NAND memory strings 208 and bonding interface 103. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 920. Memory stack 920 may be an example of memory stack 804 in FIGS. 8A-8C, and the conductive layer and dielectric layer in memory stack 920 may be examples of gate conductive layers 806 and dielectric layer 808, respectively, in memory stack 804. The interleaved conductive layers and dielectric layers in memory stack 920 alternate in the vertical direction, according to some implementations. Each conductive layer can include a gate electrode (gate line) surrounded by an adhesive layer and a gate dielectric layer. The adhesive layer can include conductive materials, such as titanium nitride (TiN), which can improve the adhesiveness between the gate electrode and the gate dielectric layer. The gate electrode of the conductive layer can extend laterally as a word line, ending at one or more staircase structures of memory stack 920.

In some implementations, each NAND memory string 208 is a "charge trap" type of NAND memory string including any suitable channel structures disclosed herein, such as bottom plug channel structure 812A, sidewall plug channel structure 812B, or bottom open channel structure 812C, described above in detail with respect to FIGS. 8A-8C. Regardless of the specific type of channel structures in NAND memory strings 208, each channel structure can extend vertically through memory stack 920, such that the source end of the channel structure can be in contact with a polysilicon layer 902, as shown in FIG. 9A. It is understood that NAND memory strings 208 are not limited to the "charge trap" type of NAND memory strings and may be "floating gate" type of NAND memory strings in other examples.

As shown in FIG. 9A, first semiconductor structure 102 can further include polysilicon layer 902 disposed above memory stack 920 and in contact with the sources of NAND memory strings 208. In some implementations, NAND memory strings 208 are disposed vertically between bonding interface 103 and polysilicon layer 902. In some implementations, NAND memory string 208 in contact with polysilicon layer 902 includes bottom open channel structure 812C in FIG. 8C. In other words, polysilicon layer 902 may be one example of semiconductor layer 805 in FIG. 8C. Polysilicon layer 902 is an N-type doped polysilicon layer to enable GIDL erase operations, according to some implementations. That is, polysilicon layer 902 can include polysilicon doped with any suitable N-type dopant(s), such as P or As. The source end of the channel structure in NAND memory strings 208, such as bottom open channel structure 812C, can be in contact with polysilicon layer 902, such as an N-type doped polysilicon layer. In some implementations, N-type doped polysilicon layer 902, which is in contact with the source end of the channel structures of NAND memory strings 208, is configured to generate a GIDL-assisted body bias when performing the GIDL erase operation. The GIDL generated at the source of NAND memory string 208 can generate hole current into the channel structure of NAND memory string 208 to raise the body potential for erase operations. As a result, NAND memory string 208 in contact with N-type doped polysilicon layer 902 is configured to perform GIDL erase operations, according to some implementations.

As shown in FIG. 9A, first semiconductor structure 102 can further include peripheral circuits 926 above interconnect layer 918. In some implementations, peripheral circuits 926 include HV circuits, such as driving circuits (e.g., string drivers 704 in row decoder/word line driver 308 and drivers in column decoder/bit line driver 306). It is understood that in some examples, peripheral circuits 926 may further include LV circuits and/or LLV circuits. It is also understood that in some examples, peripheral circuits 926 may include only LV circuits, only LLV circuits, or only HV circuits. In some implementations, peripheral circuits 926 include a plurality of transistors 928 in contact with a single crystalline silicon layer 922. Transistors 928 can include any transistors disclosed herein, such as planar transistors 500 and 3D transistors 600. As described above in detail with respect to transistors 500 and 600, in some implementations, each transistor 928 includes a gate dielectric. Trench isolations (e.g., STIs) and doped regions (e.g., wells, sources, and drains of transistors 928) can be formed on or in single crystalline silicon layer 922 as well.

Considering the process compatibility with NAND memory strings 208 (e.g., relatively high thermal budget), peripheral circuits 926 in first semiconductor structure 102 include HV circuits (without LV circuits and LLV circuits), and peripheral circuits 906 in second semiconductor structure 104 include LLV circuits and LLV circuits (without HV circuits), according to some implementations. For example, transistors 928 of peripheral circuits 926 in first semiconductor structure 102 may be configured to receive a voltage of greater than 3.3 V, such as between 5 V and 30 V, and transistors 908 of peripheral circuits 906 in second semiconductor structure 104 may be configured to receive a voltage equal to or smaller than 3.3 V. In some implementations, the material of the source/drain contact of transistor 928 (e.g., in HV circuits) in first semiconductor structure 102 includes WSi, and the material of the source/drain contact of transistor 928 (e.g., in HV circuits) in first semiconductor structure 102 includes NiSi. As described above, WSi has a higher melting point and thus a higher thermal budget than NiSi, according to some implementations. As described above, the different voltages applied to different peripheral circuits 906 and 926 in first and second semiconductor structures 102 and 104 can lead to differences in device dimensions between peripheral circuits 906 and 926. In some implementations, the thickness of the gate dielectric of transistor 928 (e.g., in HV circuits) in first semiconductor structure 102 is greater than the thickness of the gate dielectric of transistor 908 (e.g., in LLV circuits and/or LV circuits) in second semiconductor structure 104 due to the higher voltage applied to transistor 928 than transistor 908. For example, the difference between the thickness of the gate dielectric of transistor 928 and the thickness of the gate dielectric of transistor 908 may be at least 5-fold, such as between 5-fold and 50-fold.

Interconnect layer 918 can be coupled to peripheral circuits 926 and NAND memory strings 208 in first semiconductor structure 102. Transistors 928 of peripheral circuits 926 can be coupled to the control gates of NAND memory strings 208 through the interconnects in interconnect layer 918 in first semiconductor structure 102. It is understood that in some examples, transistors 928 of peripheral circuits 926 can be coupled to the control gates of NAND memory strings 208 further through the interconnects in interconnect layer 912 in second semiconductor structure 104 and bonding contacts 915 and 917 in bonding layers 914 and 916 as well to increase the routing flexibility. In some implementations, transistors 928 of peripheral circuits 926 are coupled to the conductive layers (e.g., the word lines) of memory stack 920.

As shown in FIG. 9A, first semiconductor structure 102 can further include single crystalline silicon layer 922 disposed above and in contact with transistors 928 of peripheral circuits 926. In some implementations, transistors 928 of peripheral circuits 926 are disposed vertically between bonding interface 103 and single crystalline silicon layer 922. That is, single crystalline silicon (a.k.a. single-crystal silicon or monocrystalline silicon) with superior carrier electronic properties—the lack of grain boundaries allows better charge carrier flow and prevents electron recombination—can be used as the substrate material of transistors 928 to achieve better performance.

As shown in FIG. 9A, polysilicon layer 902 and single crystalline silicon layer 922 can have a step height. That is, polysilicon layer 902 and single crystalline silicon layer 922 are noncoplanar and nonoverlapping, according to some implementations. Due to the fabrication process as described below in detail, in the lateral direction (e.g., the x-direction), polysilicon layer 902 does not extend laterally all the way to be overlapped with single crystalline silicon layer 922, and single crystalline silicon layer 922 does not extend laterally all the way to be overlapped with polysilicon layer 902, according to some implementations; in the vertical direction (e.g., the y-direction), polysilicon layer 902 and single crystalline silicon layer 922 are disposed in different planes, according to some implementations. In some implementations, transistors 928 of peripheral circuits 926 and the channel structures of NAND memory strings 208 are formed on the same side of polysilicon layer 902 and single crystalline silicon layer 922. As shown in FIG. 9A, transistors 928 can be formed on one side of single crystalline silicon layer 922 toward bonding interface 103, i.e., the negative y-direction, and the channel structures of NAND memory strings 208 can be formed on the same side of polysilicon layer 902 and extend from polysilicon layer 902 toward bonding interface 103, i.e., the negative y-direction, as well.

As shown in FIG. 9A, first semiconductor structure 102 can further include a dielectric layer 924 above and in contact with polysilicon layer 902. In some implementations, dielectric layer 924 overlaps polysilicon layer 902. Dielectric layer 924 and single crystalline silicon layer 922 can be coplanar, i.e., in the same plane. Due to the fabrication process, as described below in detail, the step height between polysilicon layer 902 and single crystalline silicon layer 922 is the same as the thickness of dielectric layer 924 in the vertical direction, according to some implementations. Dielectric layer 924 and memory stack 920 (and the channel structures of NAND memory strings 208 extending therethrough) can be disposed on opposite sides of polysilicon layer 902. That is, in some implementations, polysilicon layer 902 is disposed vertically between dielectric layer 924 and the channel structures of NAND memory strings 208. In some implementations, first semiconductor structure 102 has two regions in the plan view; single crystalline silicon layer 922 is disposed in one of the regions, while polysilicon layer 902 and dielectric layer 924 are disposed in the other one of the regions. It is understood that in some examples, dielectric layer 924 may cover single crystalline silicon layer 922 as well. That is, the thickness of dielectric layer 924 in the vertical direction is greater than the step height between polysilicon layer 902 and single crystalline silicon layer 922, according to some implementations. Dielectric layer 924 can include dielectric materials including, but not limited to, silicon oxide, silicon nitride, silicon oxynitride, low-k dielectrics, or any combination thereof. In some implementations, dielectric layer 924 includes silicon oxide.

Figure 9B:
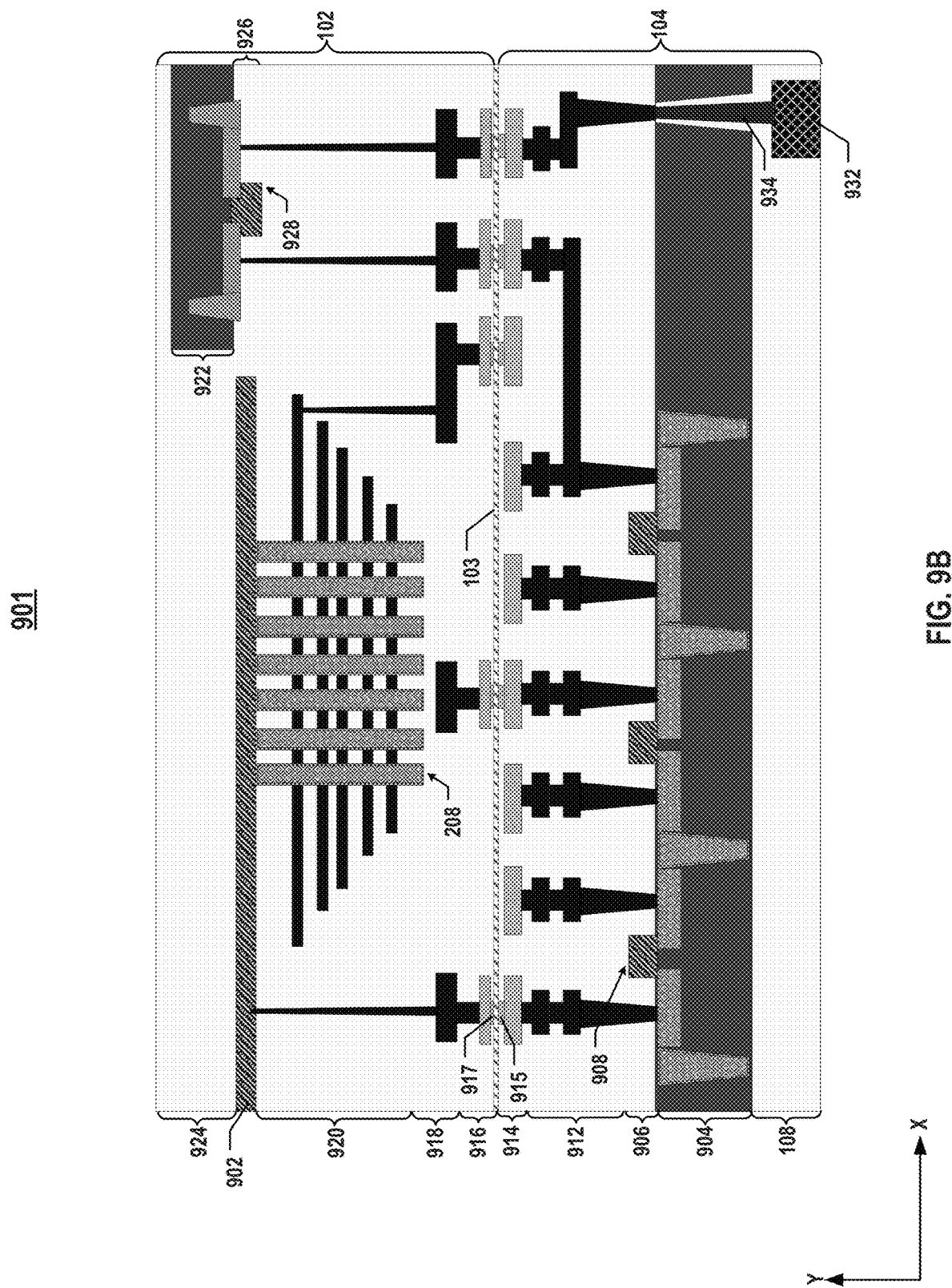
Figure 9C:
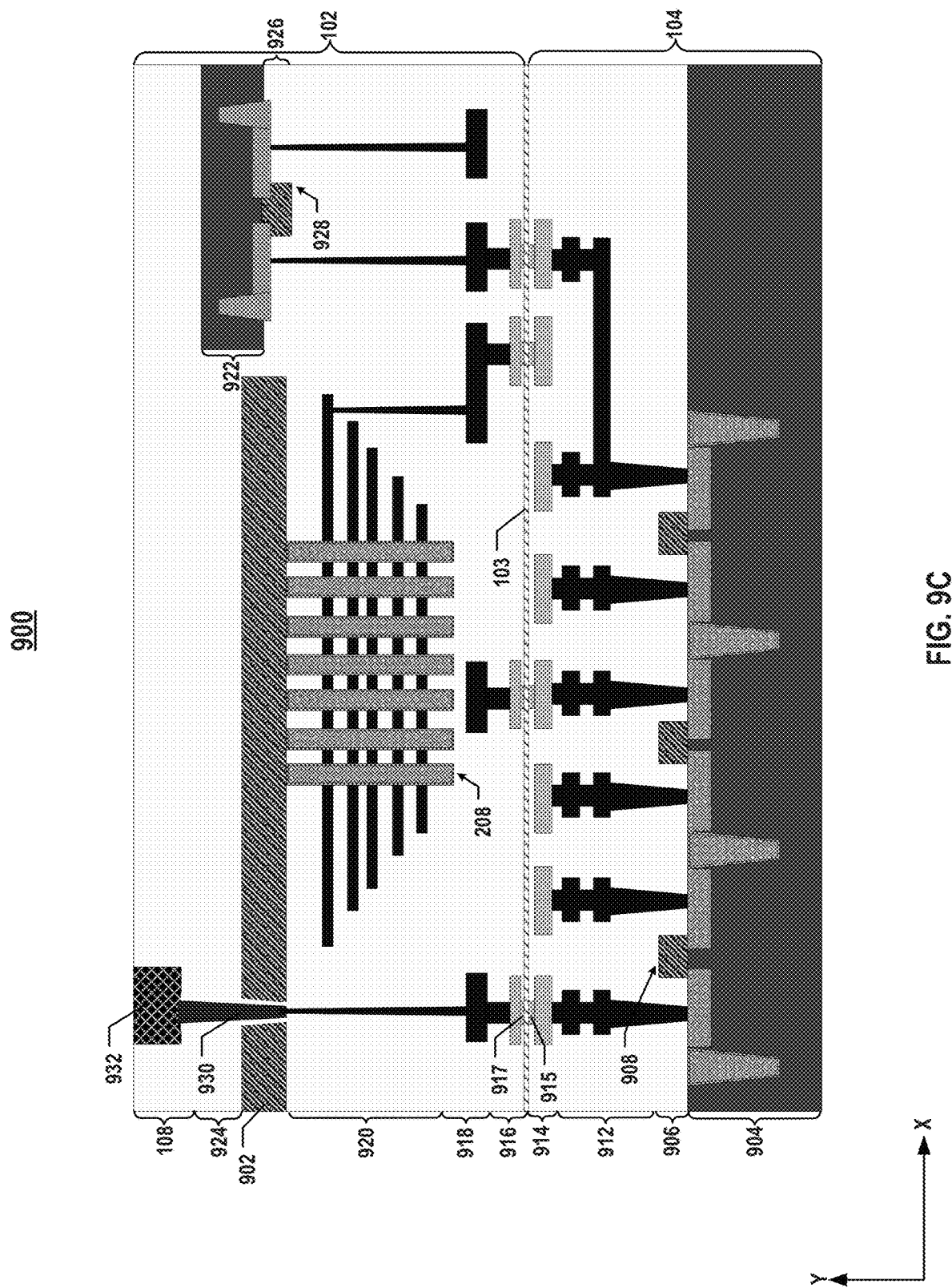
Figure 9D:
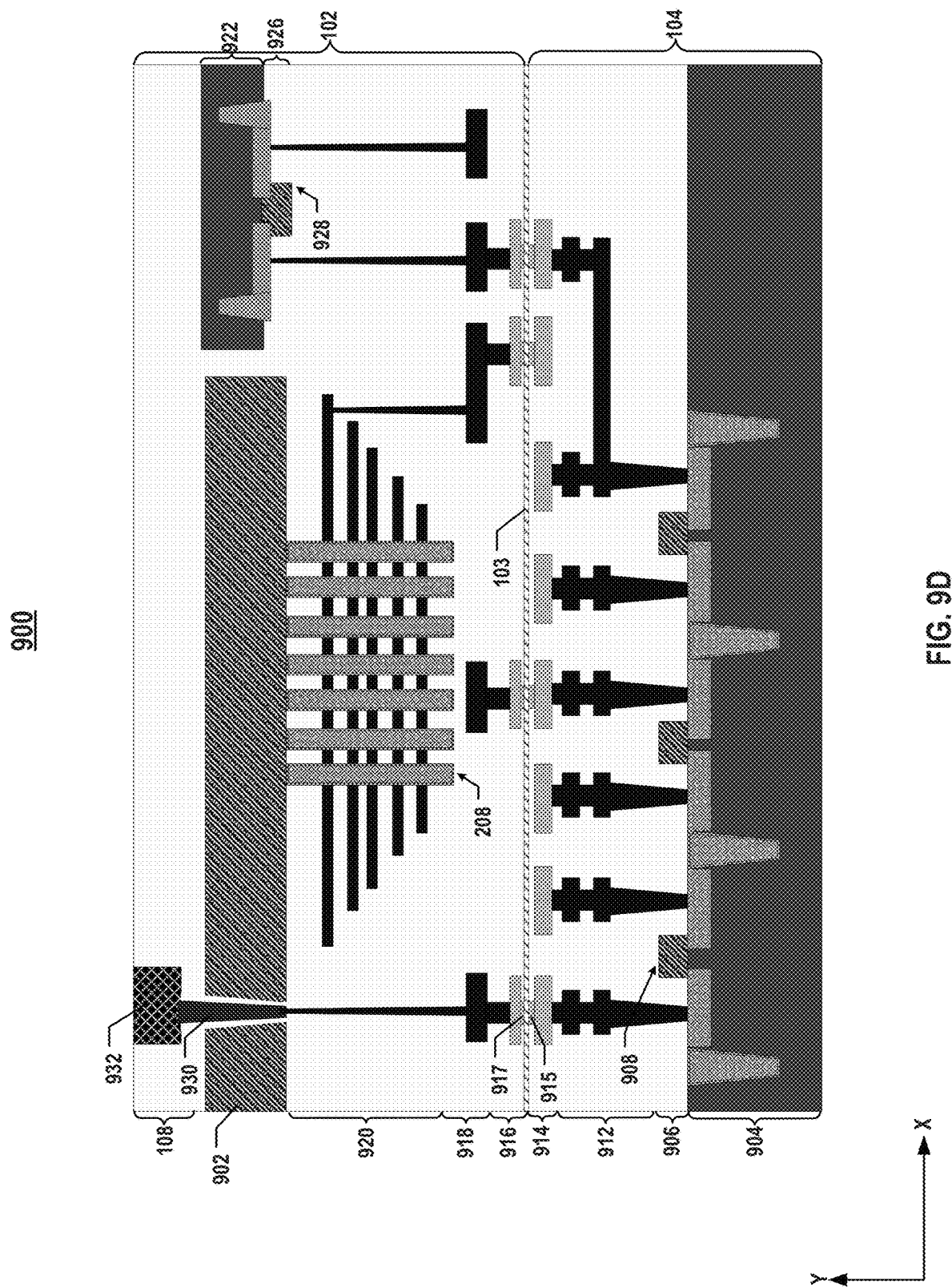

It is understood that in some examples, the step height between polysilicon layer 902 and single crystalline silicon layer 922 may vary in different examples due to different fabrication processes of forming polysilicon layer 902, as described below with respect to the fabrication process. For example, polysilicon layer 902 and single crystalline silicon layer 922 may be partially noncoplanar depending on the thickness of polysilicon layer 902. In one example, part (e.g., the upper portion) of polysilicon layer 902 may be coplanar with part (e.g., the lower portion) of single crystalline silicon layer 922, as shown in FIG. 9C. In other words, the lateral extension of the top surface of polysilicon layer 902 may be vertically between the top surface and the bottom surface of single crystalline silicon layer 922 in FIG. 9C. In another example, single crystalline silicon layer 922 may be coplanar with part (e.g., the top or middle portion) of polysilicon layer 902, for example, as shown in FIG. 9D. That is, the lateral extension of the top surface of polysilicon layer 902 may be above the top surface of single crystalline silicon layer 922 in FIG. 9D. It is understood that the thickness of dielectric layer 924 that is over polysilicon layer 902 may change accordingly as well. Nevertheless, at least part (e.g., the lower portion) of polysilicon layer 902 and single crystalline silicon layer 922 are noncoplanar, according to some implementations. In other words, polysilicon layer 902 and single crystalline silicon layer 922 are non-overlapping and at least partially noncoplanar, according to some implementations.

As shown in FIG. 9A, first semiconductor structure 102 can further include pad-out interconnect layer 108 above and in contact with dielectric layer 924 and single crystalline silicon layer 922. In some implementations, dielectric layer 924 is disposed vertically between pad-out interconnect layer 108 and polysilicon layer 902. In some implementations, peripheral circuits 926 and NAND memory strings 208 are disposed vertically between bonding interface 103 and pad-out interconnect layer 108. Pad-out interconnect layer 108 can include interconnects, e.g., contact pads 932, in one or more ILD layers. In some implementations, the interconnects in pad-out interconnect layer 108 can transfer electrical signals between 3D memory device 900 and external devices, e.g., for pad-out purposes.

As shown in FIG. 9A, first semiconductor structure 102 can further include one or more contacts 930 extending vertically through dielectric layer 924 and polysilicon layer 902. In some implementations, contact 930 couples the interconnects in interconnect layer 918 to contact pads 932 in pad-out interconnect layer 108 to make an electrical connection through polysilicon layer 902 and dielectric layer 924. Although not shown, it is understood that in some examples, one or more contacts 930 may extending vertically through single crystalline silicon layer 922, instead of dielectric layer 924 and polysilicon layer 902. Contact 930 can include conductive materials including, but not limited to, W, Co, Cu, Al, silicides, or any combination thereof. In some implementations, contact 930 includes W. In some implementations, contact 930 includes a via surrounded by a dielectric spacer (e.g., having silicon oxide) to electrically separate the via from polysilicon layer 902. Depending on the thickness of polysilicon layer 902 and dielectric layer 924, contact 930 can be an interlayer via (ILV) having a depth in the submicron-level (e.g., between 10 nm and 1 μm), or a through substrate via (TSV) having a depth in the micron- or tens micron-level (e.g., between 1 μm and 100 μm). As a result, peripheral circuits 906 and 926 and NAND memory strings 208 in 3D memory device 900 can be coupled to external devices through contacts 930 and pad-out interconnect layer 108.

It is understood that the pad-out of 3D memory devices is not limited to from first semiconductor structure 102 having NAND memory strings 208 as shown in FIGS. 9A, 9C, and 9D (corresponding to FIG. 1A) and may be from second semiconductor structure 104 having peripheral circuits 906 (corresponding to FIG. 1B). For example, as shown in FIG. 9B, a 3D memory device 901 may include pad-out interconnect layer 108 in second semiconductor structure 104. Pad-out interconnect layer 108 can be in contact with semiconductor layer 904 of second semiconductor structure 104 on which transistors 908 of peripheral circuits 906 are formed. In some implementations, second semiconductor structure 104 further includes one or more contacts 934 extending vertically through semiconductor layer 904. In some implementations, contact 934 couples the interconnects in interconnect layer 912 in second semiconductor structure 104 to contact pads 932 in pad-out interconnect layer 108 to make an electrical connection through semiconductor layer 904. Contact 934 can include conductive materials including, but not limited to, W, Co, Cu, Al, silicides, or any combination thereof. In some implementations, contact 934 includes Cu. In some implementations, contact 934 includes a via surrounded by a dielectric spacer (e.g., having silicon oxide) to electrically separate the via from semiconductor layer 904. Depending on the thickness of semiconductor layer 904, contact 934 can be an ILV having a depth in the submicron-level (e.g., between 10 nm and 1 μm), or a TSV having a depth in the micron- or tens micron-level (e.g., between 1 μm and 100 μm). It is understood that the details of the same components (e.g., materials, fabrication process, functions, etc.) in both 3D memory devices 900 and 901 are not repeated for ease of description.

FIGS. 10A-10L illustrate a fabrication process for forming 3D memory devices 900 and 901 in FIGS. 9A-9D, according to some aspects of the present disclosure. FIG. 11 illustrates a flowchart of a method 1100 for forming the 3D memory devices in FIGS. 9A-9D, according to some aspects of the present disclosure. Examples of the 3D memory devices depicted in FIGS. 10A-10L and 11 include 3D memory devices 900 and 901 depicted in FIGS. 9A-9D. FIGS. 10A-10L and 11 will be described together. It is understood that the operations shown in method 1100 are not exhaustive and that other operations can be performed as well before, after, or between any of the illustrated operations. Further, some of the operations may be performed simultaneously, or in a different order than shown in FIG. 11.

In some implementations, a first semiconductor structure is formed. The first semiconductor structure can include a single crystalline silicon substrate, a first transistor on the single crystalline silicon substrate, a step layer on the single crystalline silicon substrate, and a channel structure on the step layer. As depicted in FIG. 10D, a first semiconductor structure including the single crystalline silicon substrate, the first transistor, the step layer, and the channel structure is formed. In some implementations, a second semiconductor structure including a second transistor is formed. As depicted in FIG. 10E, a second semiconductor structure including the second transistor is formed. In some implementations, the first semiconductor structure and the second semiconductor structure are bonded in a face-to-face manner. As depicted in FIGS. 10E and 10F, the first and second semiconductor structures are bonded in a face-to-face manner. In some implementations, part of the single crystalline silicon substrate on which the polysilicon layer is formed is removed. As depicted in FIG. 10G, part of the single crystalline silicon substrate on which the polysilicon layer is formed is removed.

In some implementations, the step layer is a polysilicon layer, and a first dielectric layer is formed to fill a recess formed by removing the part of the single crystalline silicon substrate. As depicted in FIG. 10H, the first dielectric layer is formed on the polysilicon layer to fill the recess formed by removing the part of the single crystalline silicon substrate. In some implementations, the step layer is a sacrificial layer, which is removed after removing the part of the single crystalline silicon substrate to expose the channel structure, and a polysilicon layer is formed in contact with the channel structure. As depicted in FIGS. 10K and 10L, the sacrificial layer is removed to expose the channel structure, and the polysilicon layer in contact with the channel structure is formed.

Referring to FIG. 11, method 1100 starts at operation 1102, in which the first transistor is formed in a first region on a first side of the single crystalline silicon substrate. The first transistor can include a first gate dielectric. In some implementations, a second dielectric layer is formed in the first region to cover the first transistor.

Figure 10A:
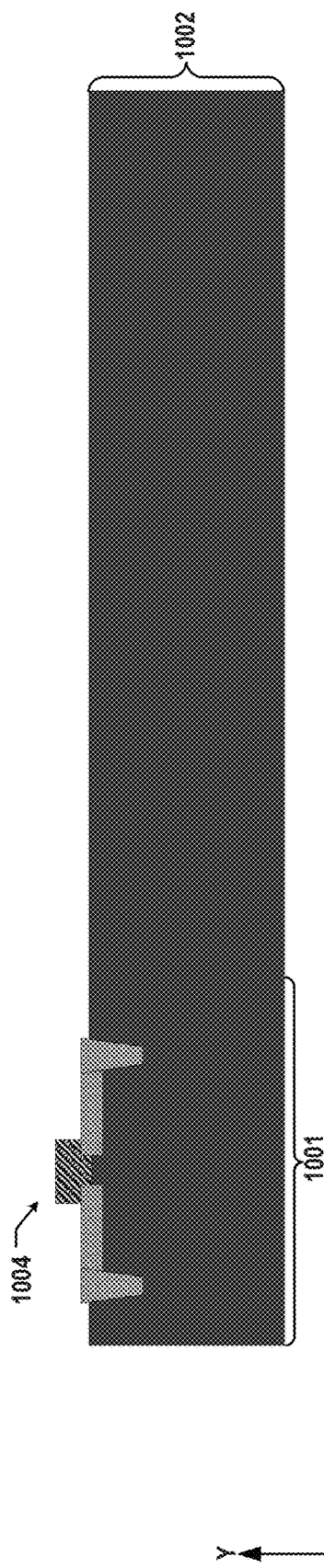
FIGS. 10A-10L illustrate a fabrication process for forming the 3D memory devices in FIGS. 9A-9D, according to some aspects of the present disclosure.
Figure 11:
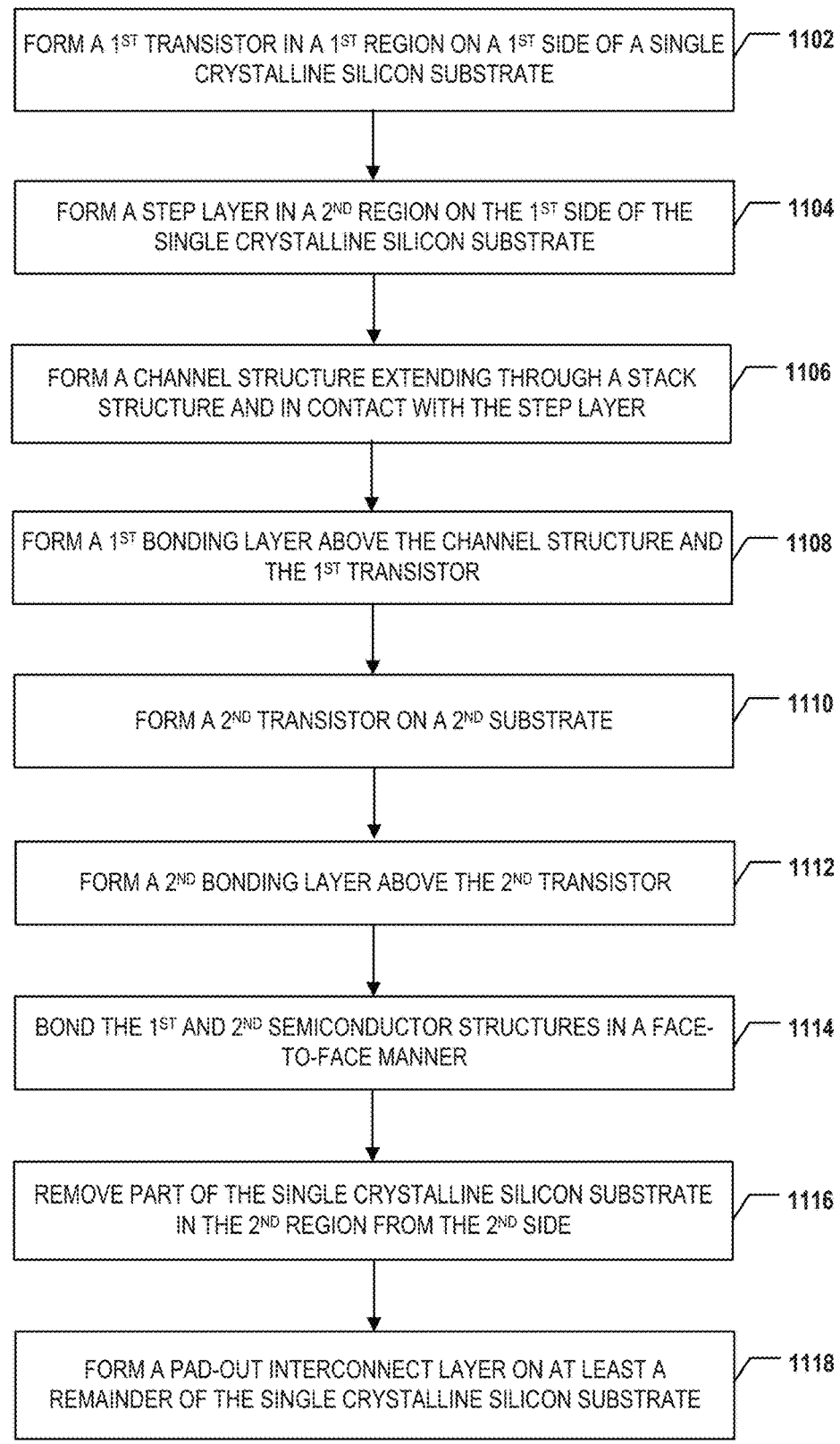
FIG. 11 illustrates a flowchart of a method for forming the 3D memory devices in FIGS. 9A-9D, according to some aspects of the present disclosure.

As illustrated in FIG. 10A, a plurality of transistors 1004 are formed in a first region 1001 on the front side of a single crystalline silicon substrate 1002. Transistors 1004 can be formed by a plurality of processes including, but not limited to, photolithography, dry/wet etch, thin film deposition, thermal growth, implantation, chemical mechanical polishing (CMP), and any other suitable processes. In some implementations, doped regions are formed in single crystalline silicon substrate 1002 by ion implantation and/or thermal diffusion, which function, for example, as the source and drain of transistors 1004. In some implementations, isolation regions (e.g., STIs) are also formed in single crystalline silicon substrate 1002 by wet/dry etch and thin film deposition. Transistors 1004 can form peripheral circuits, such as HV circuits disclosed herein, on single crystalline silicon substrate 1002. It is understood that the details of fabricating transistors 1004 may vary depending on the types of the transistors (e.g., planar transistors 500 or 3D transistors 600 in FIGS. 5A, 5B, 6A, and 6B) and thus, are not elaborated for ease of description.

Figure 10B:
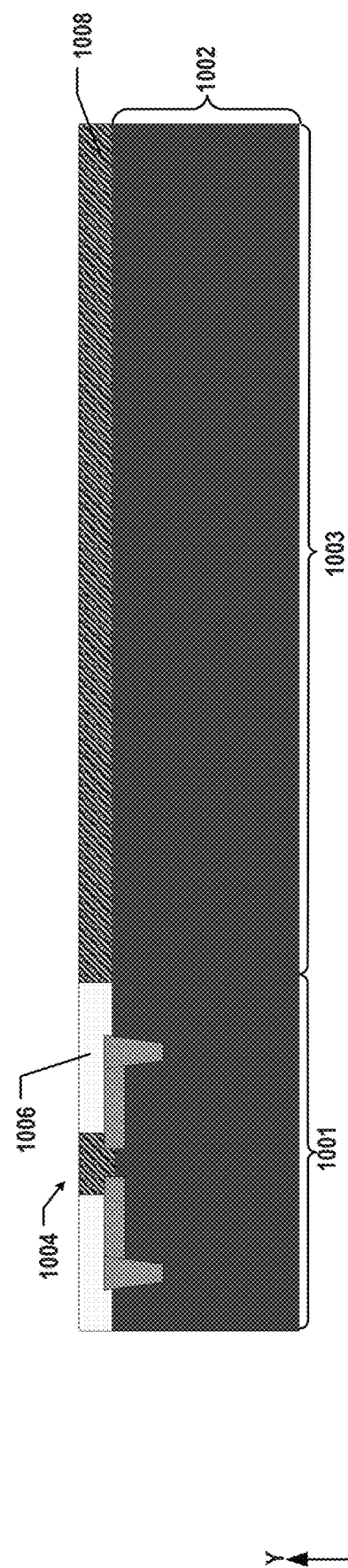

As illustrated in FIG. 10B, a dielectric layer 1006 is formed in first region 1001 to cover transistors 1004. To form dielectric layer 1006, a dielectric material, such as silicon oxide, can be deposited on single crystalline silicon substrate 1002 using one or more thin film deposition processes including, but not limited to, chemical vapor deposition (CVD), physical vapor deposition (PVD), atomic layer deposition (ALD), or any combination thereof. The deposited dielectric material can then be patterned using lithography and dry/wet etch, leaving dielectric layer 1006 in first region 1001 to cover transistors 1004.

Method 1100 proceeds to operation 1104, as illustrated in FIG. 11, in which the step layer is formed in a second region on the first side of the single crystalline silicon substrate. In some implementations, the step layer is a polysilicon layer (that remains in the final 3D memory device product after the fabrication process). In some implementations, the polysilicon layer is doped with an N-type dopant. In some implementations, the step layer is a polysilicon layer is a sacrificial layer (that is removed during the later fabrication process and will not remain in the final 3D memory device product). The sacrificial layer can include polysilicon layer (e.g., a polysilicon layer) or any other suitable material.

As illustrated in FIG. 10B, a step layer, such as a polysilicon layer 1008, is formed in a second region 1003 on the front side of single crystalline silicon substrate 1002. To form polysilicon layer 1008, polysilicon can be deposited on single crystalline silicon substrate 1002 using one or more thin film deposition processes including, but not limited to, CVD, PVD, ALD, or any combination thereof. The deposited polysilicon can then be patterned using lithography and dry/wet etch, leaving polysilicon layer 1008 in second region 1003, not overlapping with dielectric layer 1006 and transistors 1004 in first region 1001. In some implementations, polysilicon layer 1008 will remain in the final 3D memory device product after the fabrication process and is doped with N-type dopant(s), such as P or As, using ion implantation and/or thermal diffusion. In some implementations, to form N-type doped polysilicon layer 1008, in-situ doping of N-type dopant(s), such as P or As, is performed when depositing polysilicon on single crystalline silicon substrate 1002. The step layer can be either a polysilicon layer that remains in the final 3D memory device product after the fabrication process, or a sacrificial layer that is removed during the later fabrication process and will not remain in the final 3D memory device product. It is understood that in some examples, polysilicon layer 1008 may be used as a sacrificial layer to be removed during the later fabrication process and thus, may not be doped. It is also understood that the material of the sacrificial layer is not limited to polysilicon may include any other suitable sacrificial materials, such as carbon. In other words, when being used as the sacrificial layer, polysilicon layer 1008 may be replaced with another sacrificial layer in other examples. For ease of description, polysilicon layer 1008 will be used below as an example to represent the step layer.

Method 1100 proceeds to operation 1106, as illustrated in FIG. 11, in which a channel structure extending through a stack structure and in contact with the step layer is formed. The stack structure can include interleaved dielectric layers and conductive layers on the polysilicon layer. In some implementations, to form the channel structure, the dielectric layers and sacrificial layers are alternatingly deposited on the step layer, a channel hole extending through the dielectric layers and the sacrificial layers is etched, the channel structure is formed in the channel hole, and the sacrificial layers are replaced with the conductive layers.

Figure 10C:
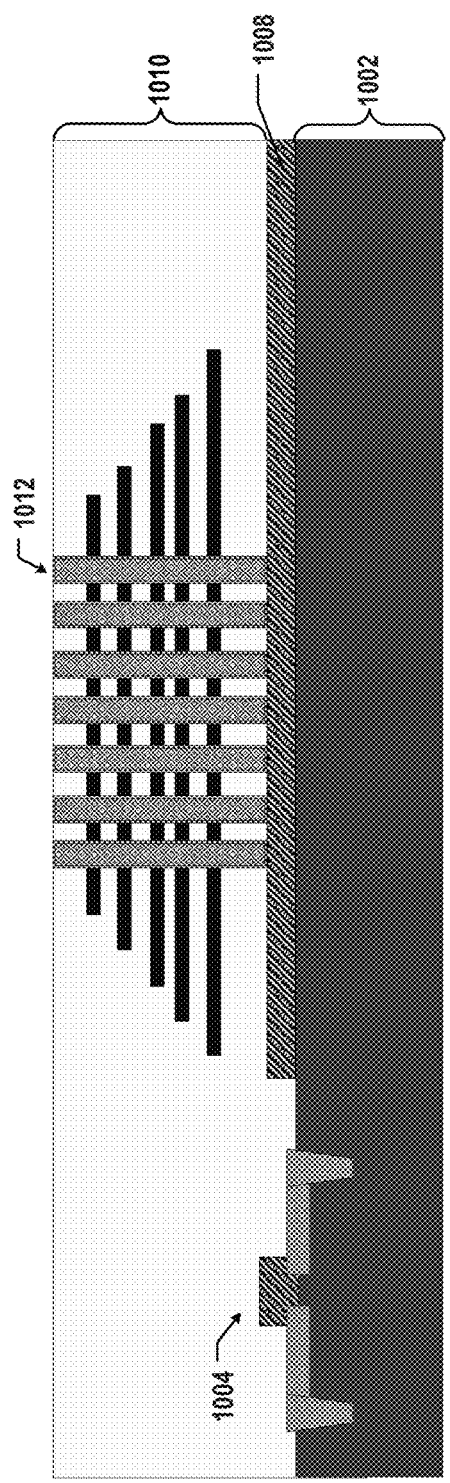
Figure 10D:
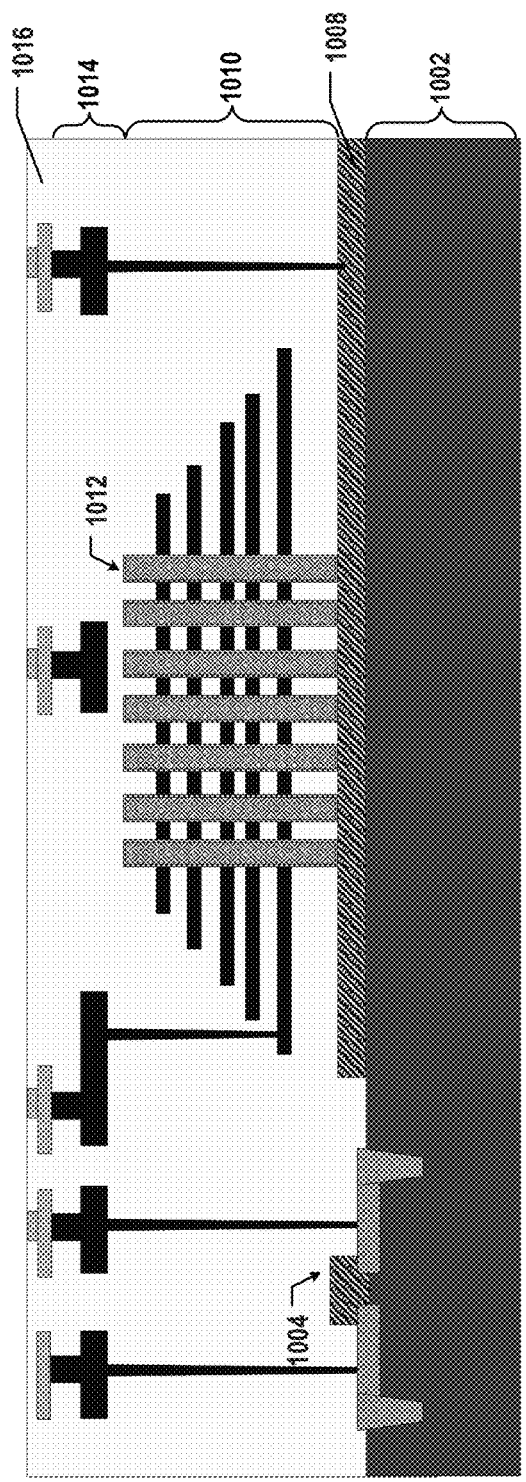
Figure 10E:
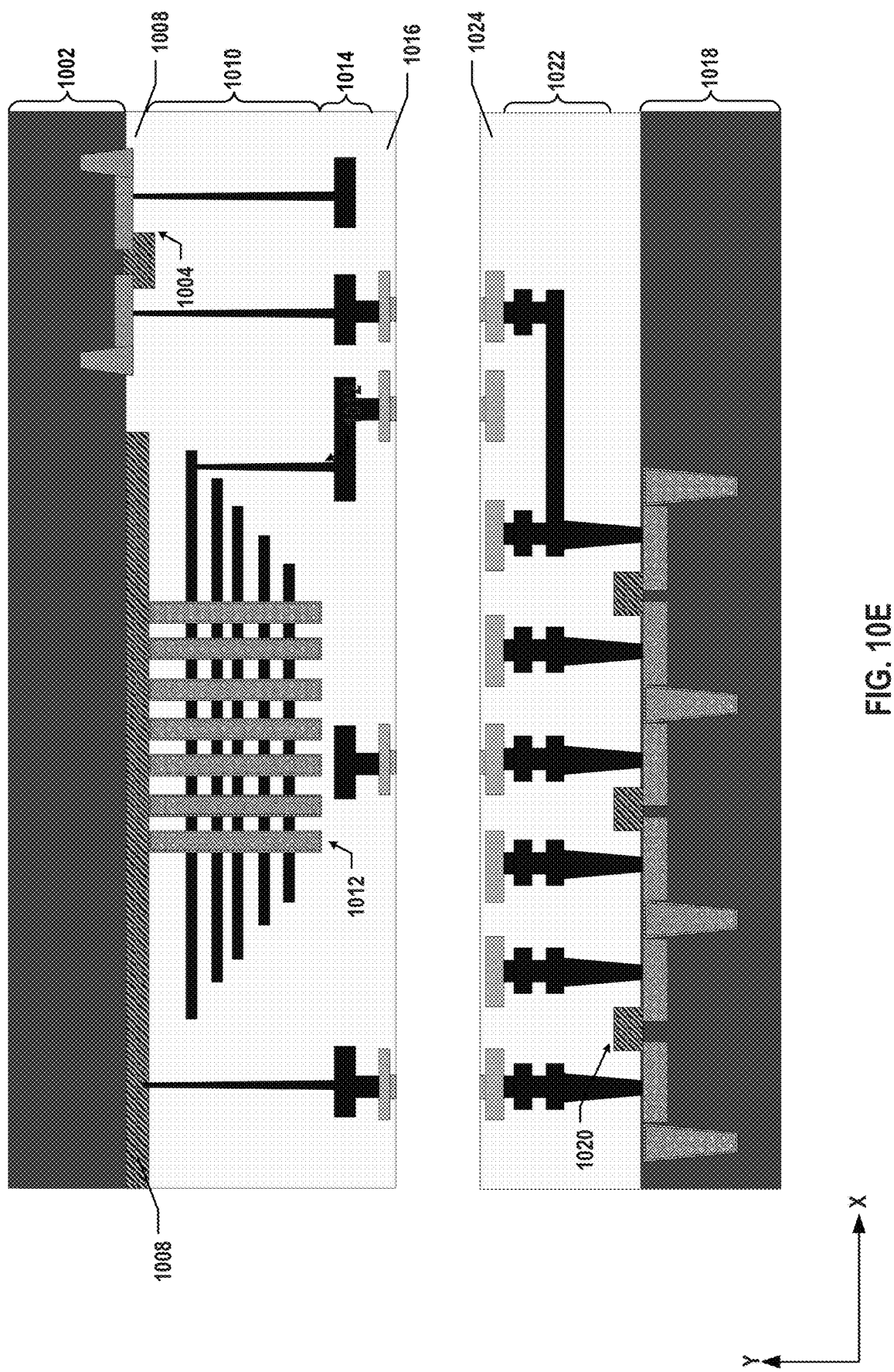
Figure 10F:
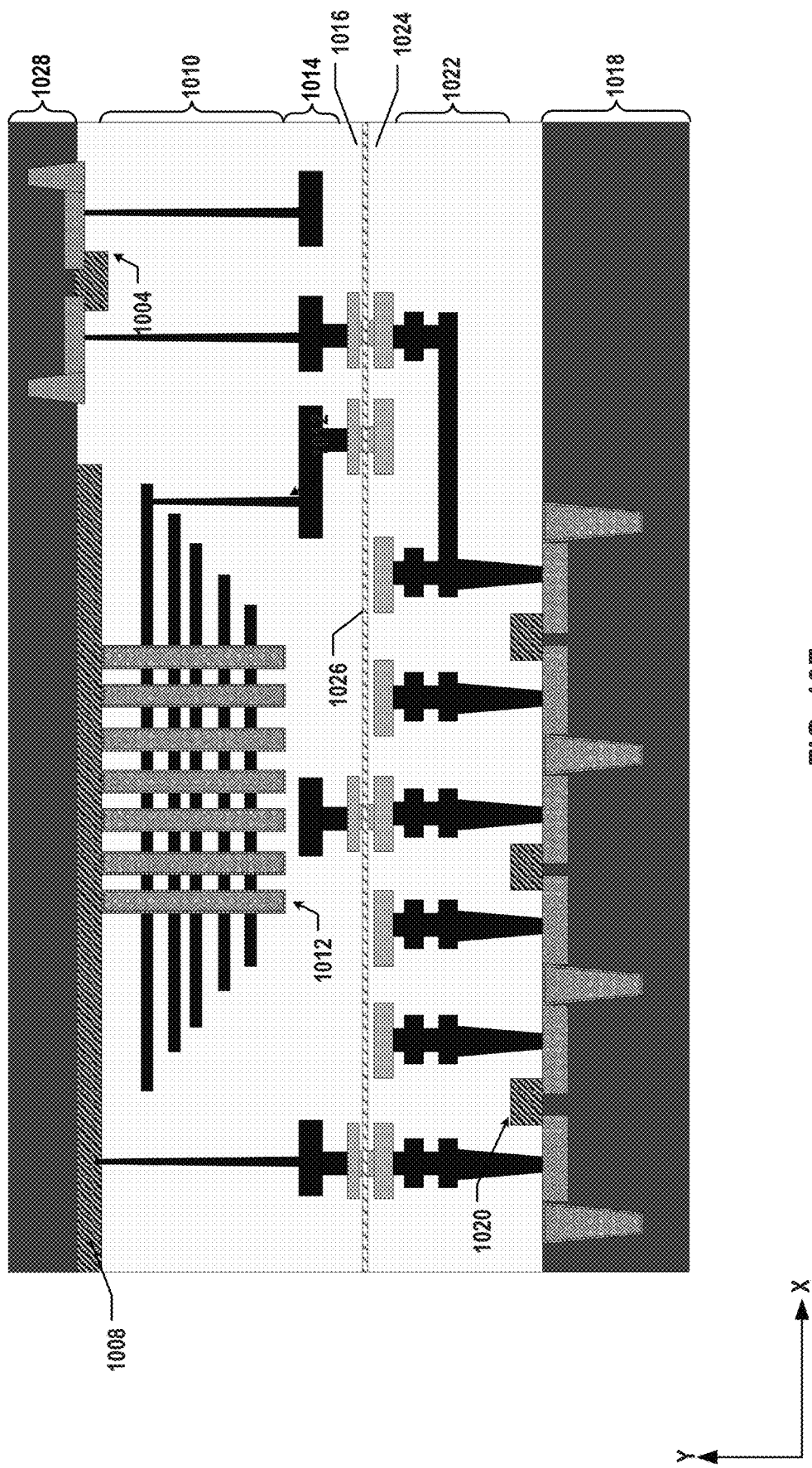
Figure 10G:
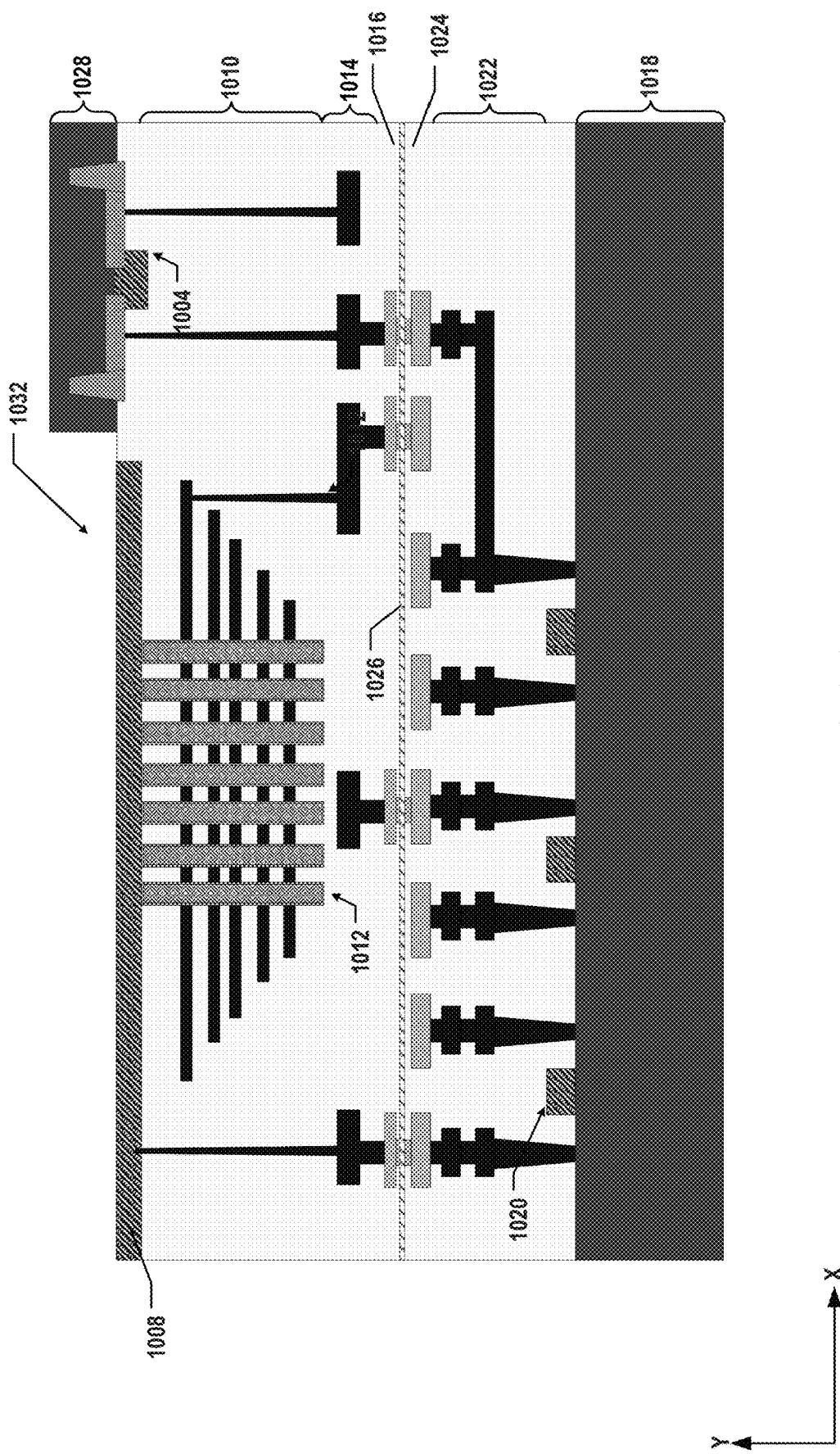
Figure 10H:
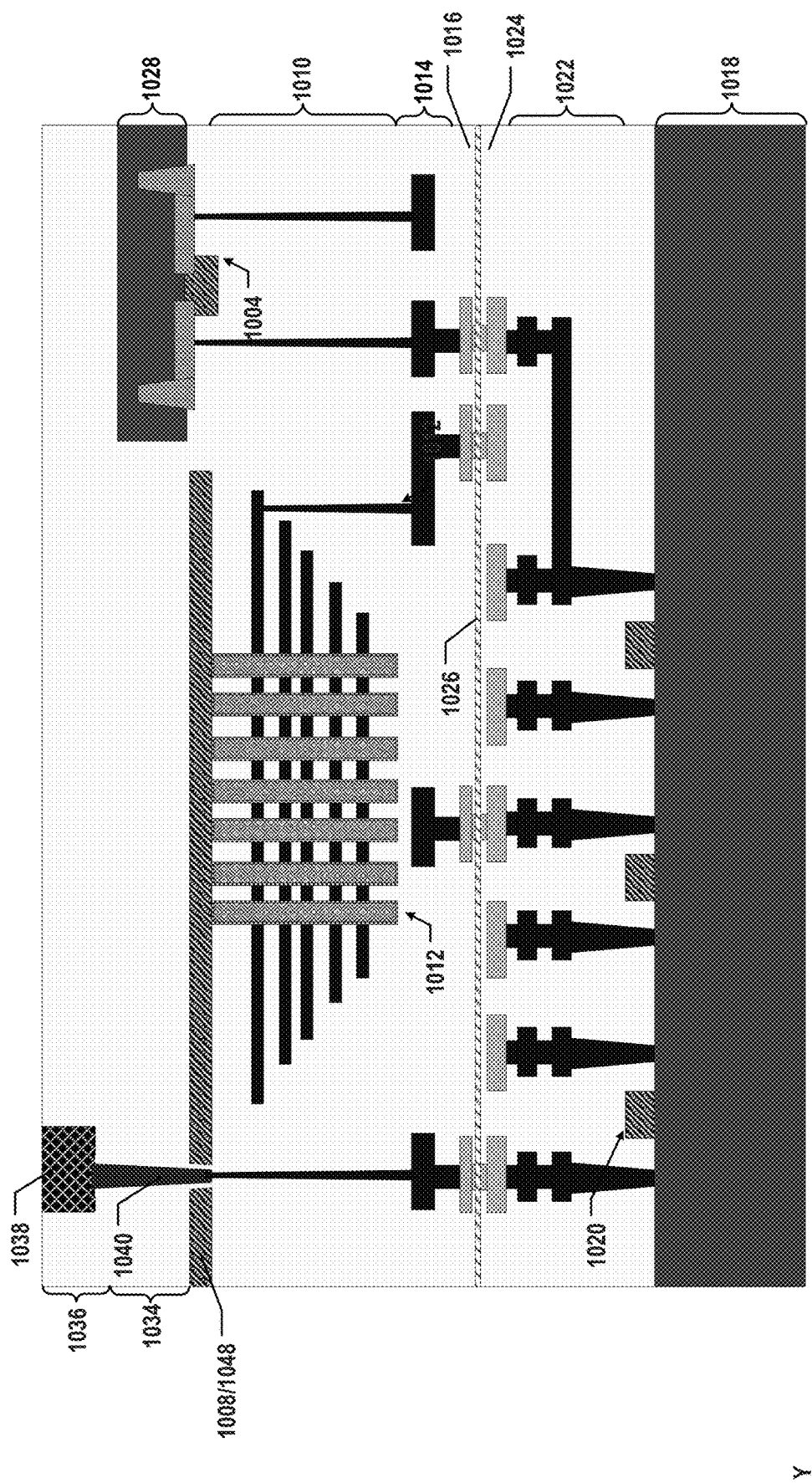

As illustrated in FIG. 10C, a stack structure, such as a memory stack 1010 including interleaved conductive layers and dielectric layers, is formed on polysilicon layer 1008. To form memory stack 1010, in some implementations, a dielectric stack (not shown) including interleaved sacrificial layers (not shown) and the dielectric layers is formed on polysilicon layer 1008. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 1010 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 1010 may be formed by alternatingly depositing conductive layers (e.g., doped polysilicon layers) and dielectric layers (e.g., silicon oxide layers) without the gate replacement process in some examples. In some implementations, a pad oxide layer (e.g., thermally grown local oxidation of silicon (LOCOS)) including silicon oxide is formed between memory stack 1010 and polysilicon layer 1008.

As illustrated in FIG. 10C, channel structures of NAND memory strings 1012 are formed on polysilicon layer 1008, each of which extends vertically through memory stack 1010 to be in contact with polysilicon layer 1008. In some implementations, fabrication processes to form the channel structures of NAND memory string 1012 include forming a channel hole through memory stack 1010 (or the dielectric stack) and into polysilicon layer 1008 using dry etching/and or wet etching, such as deep reactive-ion etching (DRIE), followed by subsequently filling the channel hole with a plurality of layers, such as a semiconductor layer (as the semiconductor channel) and a memory film (e.g., a tunneling layer, a storage layer, and a blocking layer), using thin film deposition processes such as ALD, CVD, PVD, or any combination thereof. It is understood that the details of fabricating the channel structures of NAND memory strings 1012 may vary depending on the types of channel structures of NAND memory strings 1012 (e.g., bottom plug channel structure 812A, sidewall plug channel structure 812B, or bottom open channel structure 812C in FIGS. 8A-8C) and thus, are not elaborated for ease of description. In some implementations, the memory film (e.g., memory film 818 in FIGS. 8A-8C) deposited into the channel hole is partially opened at any suitable locations thereof, e.g., at the bottom and/or on the side, using wet etching/dry etching, to form an opening to expose the semiconductor channel (e.g., semiconductor channel 820 in FIGS. 8A-8C), such that polysilicon layer 1008 can be in contact with the exposed part of the semiconductor channel through the opening in the memory film. It is understood that in some examples as described below with respect to FIGS. 10K and 10L, polysilicon layer 1008 (e.g., as a sacrificial layer) may be removed to expose the bottom of memory film of the channel structure from the backside, and an opening at the bottom of the memory film may be formed from the backside, such that another polysilicon layer 1048 formed after the formation of the opening in the memory film may be in contact with the semiconductor channel.

In some implementations, an interconnect layer is formed above the channel structures of NAND memory strings 1012 and transistors 1004. The interconnect layer can include a plurality of interconnects in one or more ILD layers. As illustrated in FIG. 10D, an interconnect layer 1014 is formed above memory stack 1010, NAND memory strings 1012, and transistors 1004. Interconnect layer 1014 can include interconnects of MEOL and/or BEOL in a plurality of ILD layers to make electrical connections with NAND memory strings 1012 and transistors 1004. In some implementations, interconnect layer 1014 includes multiple ILD layers and interconnects therein formed in multiple processes. For example, the interconnects in interconnect layer 1014 can include conductive materials deposited by one or more thin film deposition processes including, but not limited to, CVD, PVD, ALD, electroplating, electroless plating, or any combination thereof. Fabrication processes to form interconnects can also include lithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 10D can be collectively referred to as interconnect layer 1014.

Method 1100 proceeds to operation 1108, as illustrated in FIG. 11, in which a first bonding layer is formed above the channel structures and the first transistor (and the interconnect layer). The first bonding layer can include a plurality of first bonding contacts.

As illustrated in FIG. 10D, a bonding layer 1016 is formed above interconnect layer 1014. Bonding layer 1016 can include a plurality of bonding contacts surrounded by dielectrics. In some implementations, a dielectric layer is deposited on the top surface of interconnect layer 1014 by one or more thin film deposition processes including, but not limited to, CVD, PVD, ALD, or any combination thereof. The bonding contacts can then be formed through the dielectric layer and in contact with the interconnects in interconnect layer 1014 by first patterning contact holes through the dielectric layer using patterning process (e.g., lithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 1100 proceeds to operation 1110, as illustrated in FIG. 11, in which a second transistor is formed on a second substrate. The second substrate can be a single crystalline silicon substrate. The second transistor can include a second gate dielectric. In some implementations, the thickness of the first gate dielectric of the first transistor is greater than the thickness of the second gate dielectric of the second transistor.

As illustrated in FIG. 10E, a plurality of transistors 1020 are formed on a single crystalline silicon substrate 1018. Transistors 1020 can be formed by a plurality of processes including, but not limited to, lithography, dry/wet etch, thin film deposition, thermal growth, implantation, CMP, and any other suitable processes. In some implementations, doped regions are formed in single crystalline silicon substrate 1018 by ion implantation and/or thermal diffusion, which function, for example, as wells and source/drain regions of transistors 1020. In some implementations, isolation regions (e.g., STIs) are also formed in single crystalline silicon substrate 1018 by wet/dry etch and thin film deposition. Transistors 1020 can form peripheral circuits, such as LV circuits and/or LLV circuits disclosed herein, on single crystalline silicon substrate 1018. In some implementations, the thickness of gate dielectric of transistor 1020 is smaller than the thickness of gate dielectric of transistor 1004, for example, by depositing a thinner silicon oxide film when forming transistor 1020 than when forming transistor 1004, or by etching back part of the silicon oxide film deposited when forming transistor 1020. It is understood that the details of fabricating transistors 1020 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1022 is formed above transistors 1020. The interconnect layer can include a plurality of interconnects in one or more ILD layers. As illustrated in FIG. 10E, an interconnect layer 1022 can be formed above transistors 1020. Interconnect layer 1022 can include interconnects of MEOL and/or BEOL in a plurality of ILD layers to make electrical connections with transistors 1020. In some implementations, interconnect layer 1022 includes multiple ILD layers and interconnects therein formed in multiple processes. For example, the interconnects in interconnect layer 1022 can include conductive materials deposited by one or more thin film deposition processes including, but not limited to, CVD, PVD, ALD, electroplating, electroless plating, or any combination thereof. Fabrication processes to form interconnects can also include lithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 10E can be collectively referred to as interconnect layer 1022. Different from interconnect layer 1014, in some implementations, the interconnects in interconnect layer 1022 include Cu, which has a relatively low resistivity among conductive metal materials. It is understood that although Cu has a relatively low thermal budget (incompatible with high-temperature processes), using Cu as the conductive materials of the interconnects in interconnect layer 1022 may become feasible since there are no more high temperature processes after the fabrication of interconnect layer 1022.

Method 1100 proceeds to operation 1112, as illustrated in FIG. 11, in which a second bonding layer is formed above the second transistor. The second bonding layer can include a plurality of second bonding contacts.

As illustrated in FIG. 10E, a bonding layer 1024 is formed above interconnect layer 1022 and transistors 1020. Bonding layer 1024 can include a plurality of bonding contacts surrounded by dielectrics. In some implementations, a dielectric layer is deposited on the top surface of interconnect layer 1022 by one or more thin film deposition processes including, but not limited to, CVD, PVD, ALD, or any combination thereof. The bonding contacts can then be formed through the dielectric layer and in contact with the interconnects in interconnect layer 1022 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor. For example, the adhesion layer may improve the adhesiveness of the conductor to avoid defects, the barrier layer may prevent metal ion (e.g., Cu ions) diffusing from the conductor into other structures to cause contamination, and the seed layer may facilitate the deposition of the conductor (e.g., Cu) in the contact holes to improve the deposition quality and speed.

Method 1100 proceeds to operation 1114, as illustrated in FIG. 11, in which the first semiconductor structure and the second semiconductor structure are bonded in a face-to-face manner. The first bonding contact in the first bonding layer can be in contact with the second bonding contact in the second bonding layer at a bonding interface after bonding the first and second semiconductor structures. The bonding can include hybrid bonding.

As illustrated in FIGS. 10E and 10F, the first semiconductor structure having single crystalline silicon substrate 1002 and components formed thereon (e.g., transistors 1004, memory stack 1010 and NAND memory strings 1012 formed therethrough) are flipped upside down. Bonding layer 1016 facing down is bonded with bonding layer 1024 facing up, i.e., in a face-to-face manner, thereby forming a bonding interface 1026. That is, the first semiconductor structure having single crystalline silicon substrate 1002 and components formed thereon can be bonded with the second semiconductor structure having single crystalline silicon substrate 1018 and components formed thereon in a face-to-face manner, such that the bonding contacts in bonding layer 1016 are in contact with the bonding contacts in bonding layer 1024 at bonding interface 1026. In some implementations, bonding interface 1026 is the place at which bonding layers 1016 and 1024 are met and bonded, including, for example, the place at which a bonding contact in bonding layer 1016 is met and bonded with a corresponding bonding contact in bonding layer 1024. In practice, bonding interface 1026 can be a layer with a certain thickness that includes the top surface of bonding layer 1024 and the bottom surface of bonding layer 1016, for example, as shown in FIG. 10F. In some implementations, a treatment process, e.g., plasma treatment, wet treatment and/or thermal treatment, is applied to bonding surfaces prior to bonding. Although not shown in FIGS. 10E and 10F, it is understood that in some examples, the second semiconductor structure having single crystalline silicon substrate 1018 and components formed thereon (e.g., transistors 1020) can be flipped upside down, and bonding layer 1024 facing down can be bonded with bonding layer 1016 facing up, i.e., in a face-to-face manner, thereby forming bonding interface 1026 as well.

As a result of the bonding, e.g., hybrid bonding, the bonding contacts on opposite sides of bonding interface 1026 can be inter-mixed. After the bonding, the bonding contacts in bonding layer 1016 and the bonding contacts in bonding layer 1024 are aligned and in contact with one another, such that transistors 1004 and NAND memory strings 1012 can be coupled to transistors 1020 through the bonded bonding contacts across bonding interface 1026, according to some implementations.

Method 1100 proceeds to operation 1116, as illustrated in FIG. 11, in which the part of the single crystalline silicon substrate on which the polysilicon layer is formed is remove. In some implementations, to remove the part of the single crystalline silicon substrate, the part of the single crystalline silicon substrate is removed from a second side opposite to the first side of the single crystalline silicon substrate to form a recess. In some implementations, prior to removing the part of the single crystalline silicon substrate, the single crystalline silicon substrate is thinned from the second side.

As illustrated in FIG. 10F, single crystalline silicon substrate 1002 (shown in FIG. 10E) is thinned to become a single crystalline silicon layer 1028. Single crystalline silicon substrate 1002 can be thinned from the backside by processes including, but not limited to, wafer grinding, dry etch, wet etch, CMP, any other suitable processes, or any combination thereof.

As illustrated in FIG. 10G, part of single crystalline silicon layer 1028 (shown in FIG. 10F) in second region 1003 (shown in FIG. 10B), which is in contact with polysilicon layer 1008, is removed from the backside to form a recess 1032 in second region 1003, thereby exposing polysilicon layer 1008 from the backside. The remainder of single crystalline silicon layer 1028 can remain intact in first region 1001 (shown in FIG. 10B). To remove the part of single crystalline silicon layer 1028 on which polysilicon layer 1008 is formed, single crystalline silicon layer 1028 can be patterned using photography with an etch mask, followed by a dry etching and/or wet etching process to etch away single crystalline silicon layer 1028 uncovered by the etching mask in second region 1003. The etching process can be controlled, for example, by controlling the etching rate and/or etching duration, to stop at polysilicon layer 1008. It is understood that in some examples, polysilicon layer 1008 may be doped from the backside after removing part of single crystalline silicon layer 1028, as opposed to when forming polysilicon layer 1008 on single crystalline silicon layer 1028. For example, polysilicon layer 1008 may be doped with N-type dopant(s), such as P or As, from the backside using ion implantation and/or thermal diffusion. As a result, polysilicon layer 1008 (e.g., N-type doped polysilicon layer 1008) can be exposed from the backside by recess 1032 with a step height from the remainder of single crystalline silicon layer 1028.

In some implementations, the step layer is a polysilicon layer, and a first dielectric layer is formed to fill the recess. That is, the part of the single crystalline silicon substrate on which the polysilicon layer is formed can be replaced with the first dielectric layer.

As illustrated in FIG. 10H, recess 1032 (shown in FIG. 10G) is filled with a dielectric layer 1034. In some implementations, dielectric layer 1034 is formed on polysilicon layer 1008 and have a top surface flush with the top surface of the remainder of single crystalline silicon layer 1028. In some implementations, dielectric layer 1034 is also formed on the remainder of single crystalline silicon layer 1028 to cover the remainder of single crystalline silicon layer 1028 as well. That is, the top surface of dielectric layer 1034 can be above the top surface of the remainder of single crystalline silicon layer 1028. To form dielectric layer 1034, a dielectric material, such as silicon oxide, is deposited on the top surface of polysilicon layer 1008 and the remainder of single crystalline silicon layer 1028 using one or more thin film deposition processes including, but not limited to, CVD, PVD, ALD, or any combination thereof, to fill recess 1032. In some implementations, a planarization process, such as CMP, is performed to remove the excessive dielectric material, such that the top surface of dielectric layer 1034 is flush with the top surface of the remainder of single crystalline silicon layer 1028. In some implementations, the planarization does not remove all the dielectric material deposited on the remainder of single crystalline silicon layer 1028, such that the top surface of dielectric layer 1034 is above the top surface of the remainder of single crystalline silicon layer 1028. Nevertheless, part of single crystalline silicon layer 1028 in second region 1003 on which polysilicon layer 1008 is formed is replaced with dielectric layer 1034, according to some implementations.

Alternatively, in some implementations, the step layer is a sacrificial layer. In some implementations, the sacrificial layer is removed after removing the part of the single crystalline silicon substrate to expose the channel structure, and a polysilicon layer in contact with the channel structure is formed. In some implementations, the polysilicon layer is doped with an N-type dopant.

Alternatively, as illustrated in FIG. 10K, polysilicon layer 1008 (as a sacrificial layer shown in FIG. 10G) is removed to expose, from the backside, the source ends of the channel structures of NAND memory string 1012. Polysilicon layer 1008 can be removed by etching polysilicon layer 1008 using dry etching and/or dry etching, without etching single crystalline silicon layer 1028. In one example, an etch mask may be formed to cover single crystalline silicon layer 1028 during the etching. In another example, an etchant for polysilicon layer 1008 with a high selectivity (e.g., greater than 5) against single crystalline silicon layer 1028 may be used. Recess 1032 can be thereby extended deeper after removing polysilicon layer 1008.

As illustrated in FIG. 10L, a polysilicon layer 1048 is formed in recess 1032 (shown in FIG. 10K) to be in contact with the source ends of the channel structures of NAND memory string 1012. In some implementations, prior to forming polysilicon layer 1048, openings are formed in the memory films of the channel structures (e.g., bottom open channel structures 812C) at the source ends thereof by drying etching and/or wet etching to expose parts of the semiconductor channels of the channel structures at the source ends. As a result, polysilicon layer 1048 can be in contact with the exposed parts of the semiconductor channels of the channel structures (e.g., bottom open channel structures 812C) at the source ends. To form polysilicon layer 1048, polysilicon can be deposited into recess 1032 using one or more thin film deposition processes including, but not limited to, CVD, PVD, ALD, or any combination thereof, to partially or fully fill recess 1032. It is understood that the thickness of polysilicon layer 1048 may vary in different examples. In some implementations as shown in FIG. 10L, polysilicon layer 1048 partially fills recess 1032, and the remaining space of recess 1032 is filled with dielectric layer 1034 as described above in FIG. 10H. In some implementations, polysilicon layer 1048 fully fills recess 1032 (not shown), and a planarization process, such as CMP, is performed to remove the excessive polysilicon, such that the top surface of polysilicon layer 1048 is flush with the top surface of the remainder of single crystalline silicon layer 1028.

Method 1100 proceeds to operation 1118, as illustrated in FIG. 1, in which a pad-out interconnect layer is formed on at least a remainder of the single crystalline silicon substrate. In some implementations, a contact extending through the polysilicon layer is formed. In some implementations, the pad-out interconnect layer is formed on the first dielectric layer as well, and the contact extends through the first dielectric layer as well and is in contact with the pad-out interconnect layer.

As illustrated in FIG. 10H, a pad-out interconnect layer 1036 is formed on dielectric layer 1034 and the remainder of single crystalline silicon layer 1028. Pad-out interconnect layer 1036 can include interconnects, such as contact pads 1038, formed in one or more ILD layers. Contact pads 1038 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after forming dielectric layer 1034, contacts 1040 are formed, extending vertically through dielectric layer 1034 and polysilicon layer 1008/1048, for example, by wet/dry etching followed by depositing dielectric materials as spacers and conductive materials as conductors. Contacts 1040 can couple contact pads 1038 in pad-out interconnect layer 1036 to the interconnects in interconnect layer 1014.

Figure 10I:
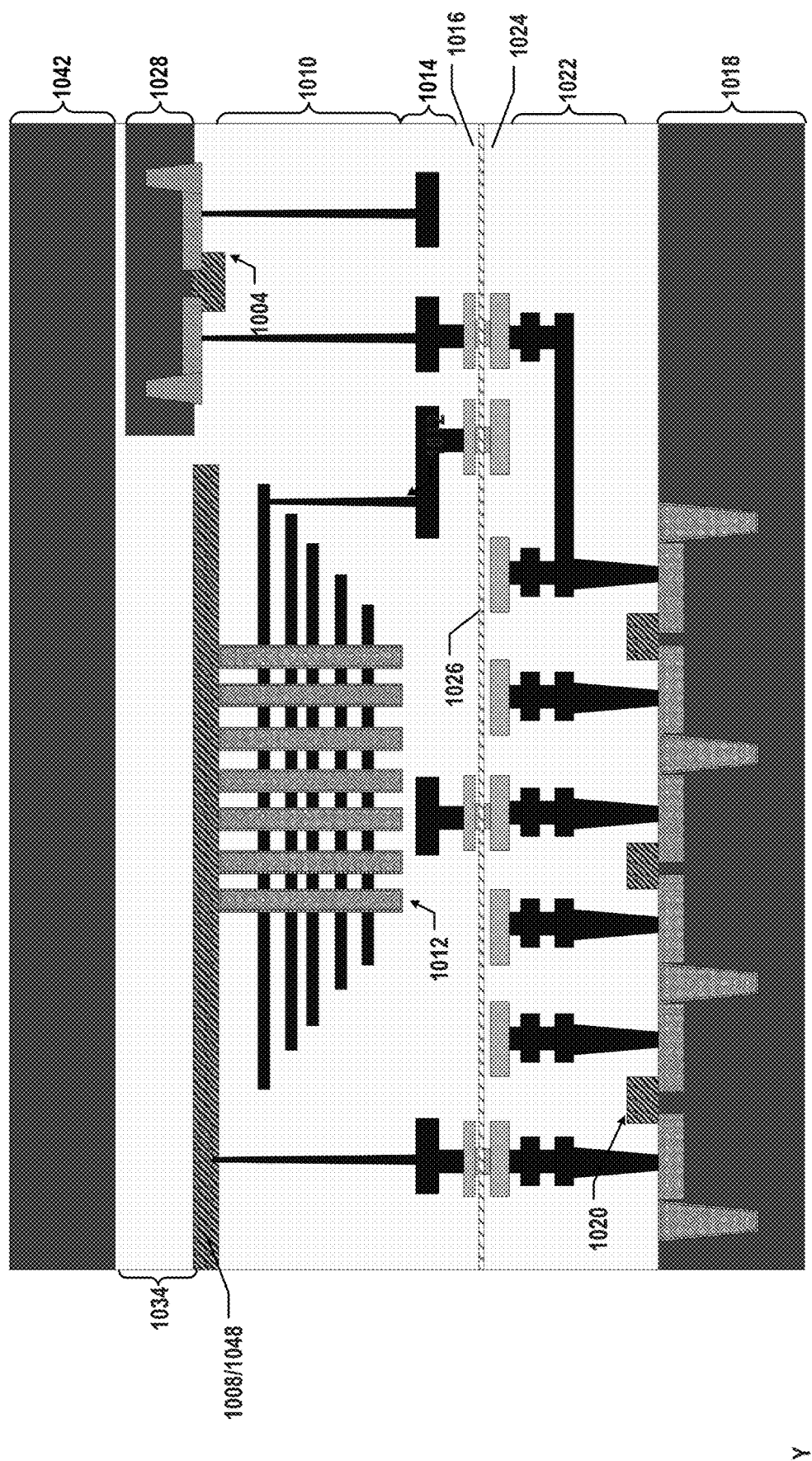
Figure 10J:
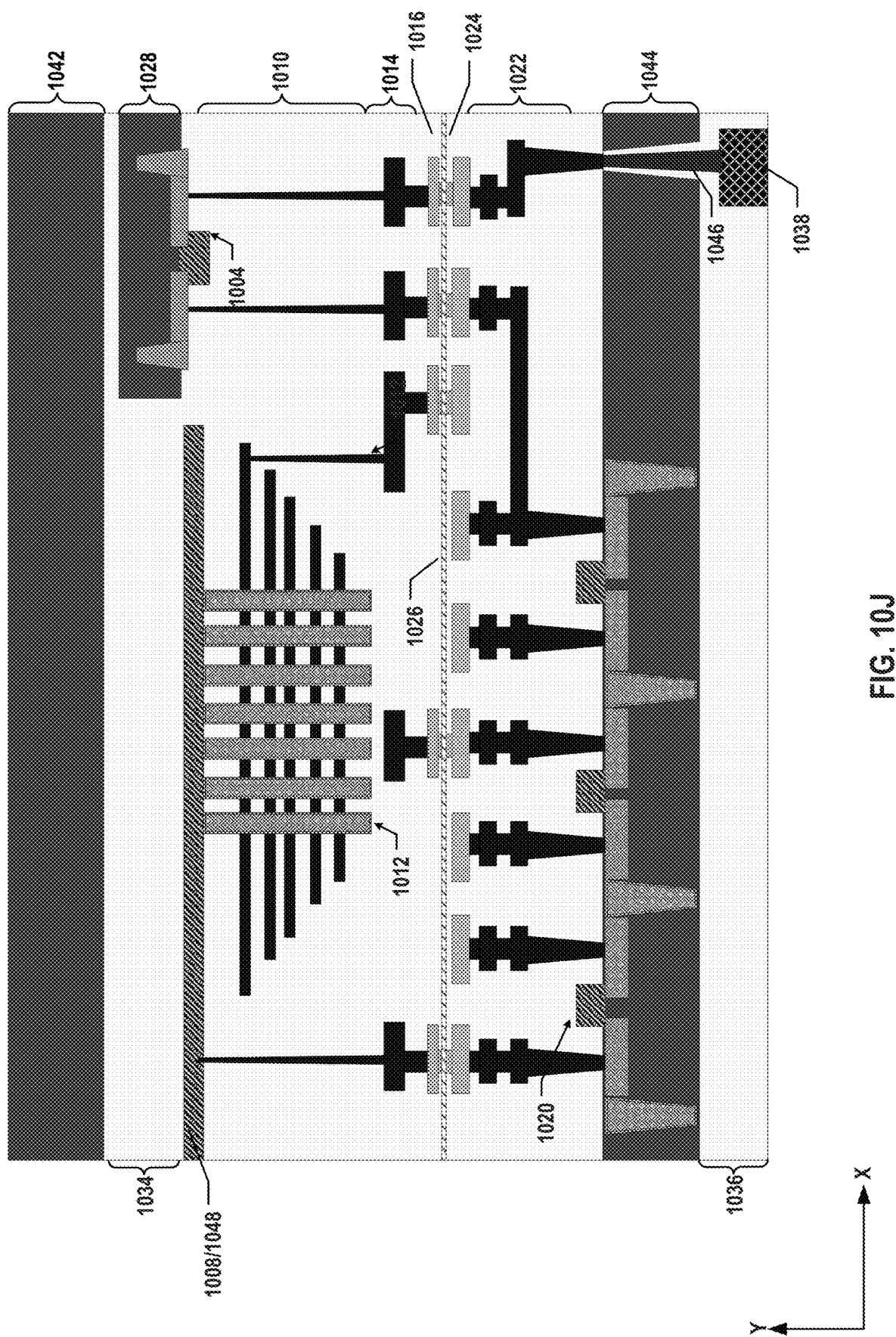
Figure 10K:
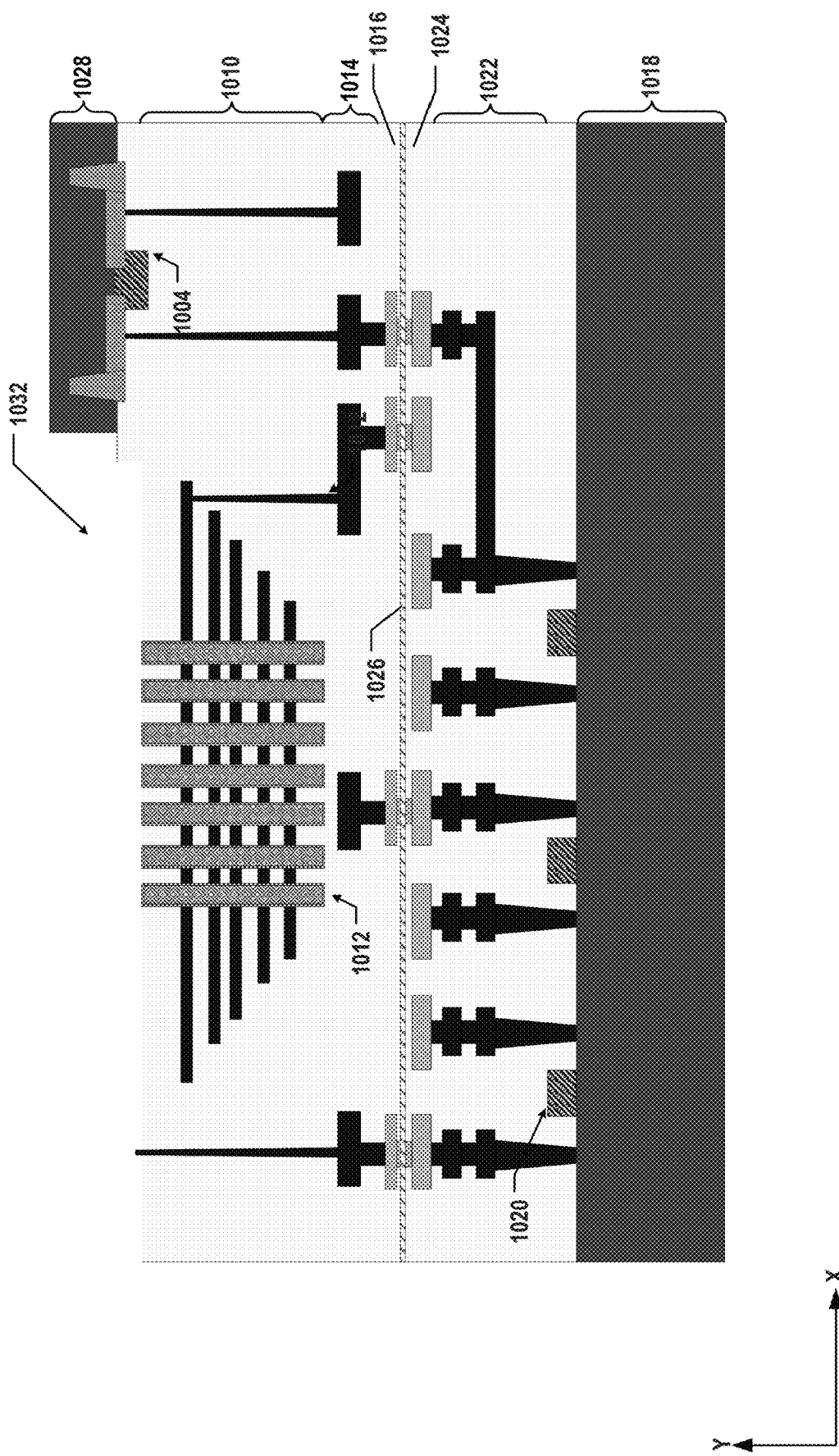
Figure 10L:
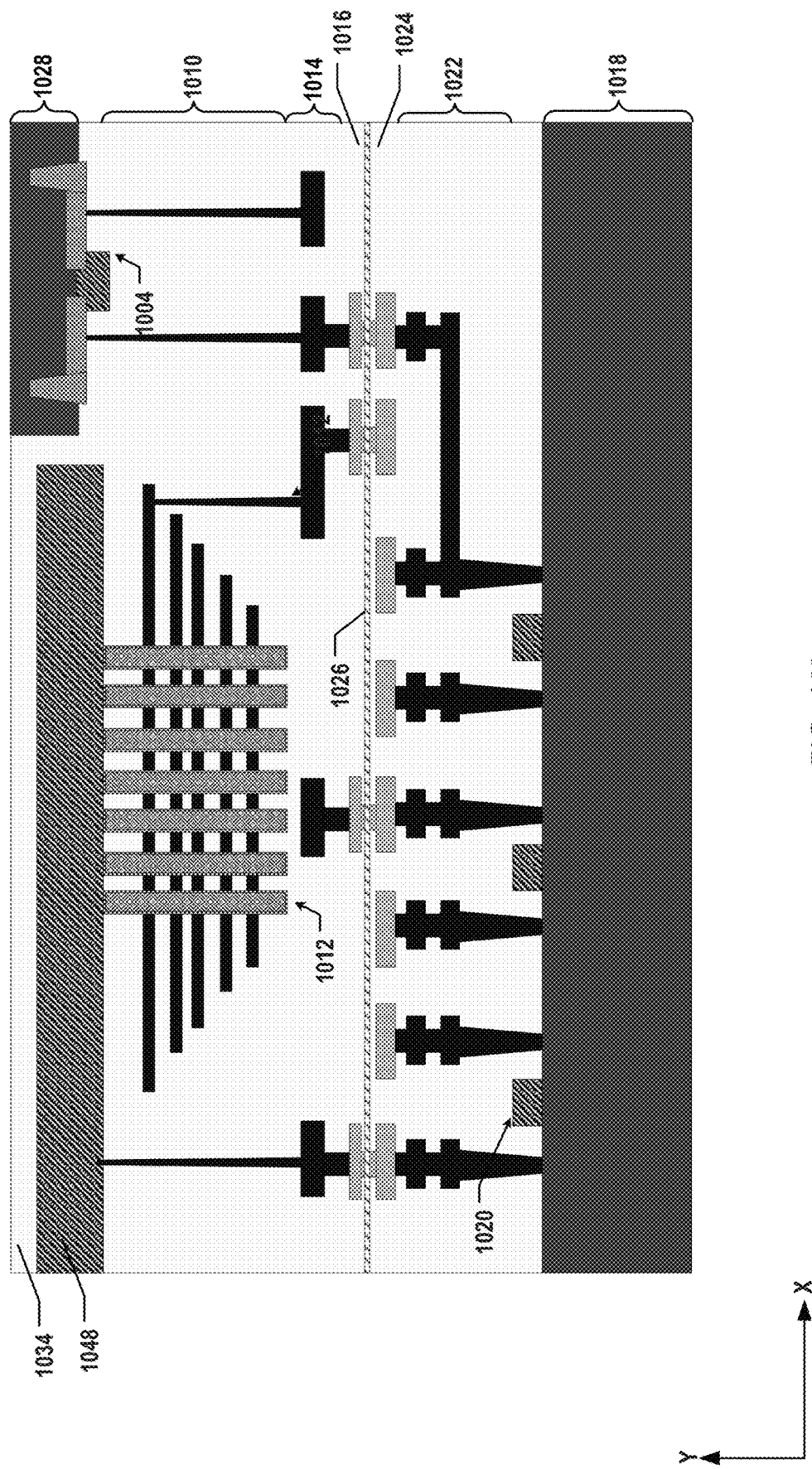

It is understood that the pad-out interconnect layer may be formed on either the first semiconductor structure or the second semiconductor structure after replacing the part of the single crystalline silicon substrate with the first dielectric layer. For example, a pad-out interconnect layer may be formed on the thinned single crystalline silicon substrate 1018, and contacts may be formed through the thinned single crystalline silicon substrate 1018 to couple the pad-out interconnect layer and interconnect layer 1022 across the thinned single crystalline silicon substrate 1018. As illustrated in FIG. 10I, a handle substrate 1042 (a.k.a. a carrier substrate) can be bonded on the backside of dielectric layer 1034 and the remainder of single crystalline silicon layer 1028. Single crystalline silicon substrate 1018 on which transistors 1020 are formed can then be thinned to form a single crystalline silicon layer 1044. As illustrated in FIG. 10J, pad-out interconnect layer 1036 is then be formed on single crystalline silicon layer 1044. After thinning single crystalline silicon substrate 1018, contacts 1046 are formed, extending vertically through single crystalline silicon layer 1044, for example, by wet/dry etching followed by depositing dielectric materials as spacers and conductive materials as conductors. Contacts 1046 can couple contact pads 1038 in pad-out interconnect layer 1036 to the interconnects in interconnect layer 1022.

Figure 12:
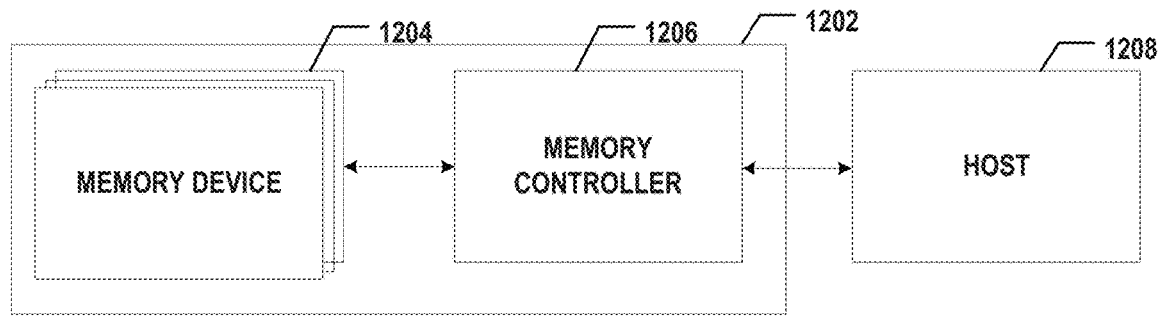
FIG. 12 illustrates a block diagram of an exemplary system having a memory device, according to some aspects of the present disclosure.

FIG. 12 illustrates a block diagram of a system 1200 having a memory device, according to some aspects of the present disclosure. System 1200 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 12, system 1200 can include a host 1208 and a memory system 1202 having one or more memory devices 1204 and a memory controller 1206. Host 1208 can be a processor of an electronic device, such as a central processing unit (CPU), or a system-on-chip (SoC), such as an application processor (AP). Host 1208 can be configured to send or receive the data to or from memory devices 1204.

Memory device 1204 can be any memory devices disclosed herein, such as 3D memory devices 100 and 101. In some implementations, each memory device 1204 includes a single crystalline silicon layer, a polysilicon layer, a NAND memory string, and a peripheral circuit of the NAND memory string. The peripheral circuit can include a transistor in contact with the single crystalline silicon layer, and the NAND memory string can include a channel structure in contact with the polysilicon layer, as described above in detail.

Memory controller 1206 is coupled to memory device 1204 and host 1208 and is configured to control memory device 1204, according to some implementations. Memory controller 1206 can manage the data stored in memory device 1204 and communicate with host 1208. In some implementations, memory controller 1206 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1206 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1206 can be configured to control operations of memory device 1204, such as read, erase, and program operations. In some implementations, memory controller 1206 is configured to control the array of memory cells through the first peripheral circuit and the second peripheral circuit. Memory controller 1206 can also be configured to manage various functions with respect to the data stored or to be stored in memory device 1204 including, but not limited to bad-block management, garbage collection, logical-to-physical address conversion, wear leveling, etc. In some implementations, memory controller 1206 is further configured to process error correction codes (ECCs) with respect to the data read from or written to memory device 1204. Any other suitable functions may be performed by memory controller 1206 as well, for example, formatting memory device 1204. Memory controller 1206 can communicate with an external device (e.g., host 1208) according to a particular communication protocol. For example, memory controller 1206 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 13A:
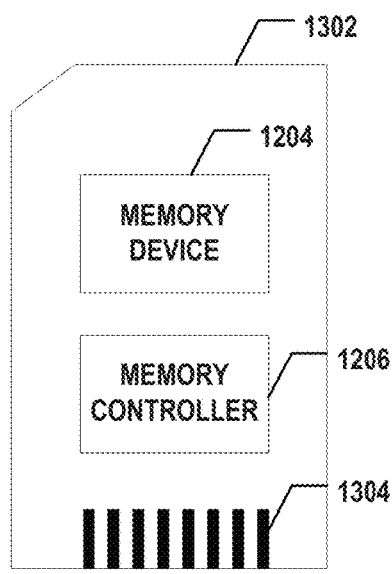
FIG. 13A illustrates a diagram of an exemplary memory card having a memory device, according to some aspects of the present disclosure.
Figure 13B:
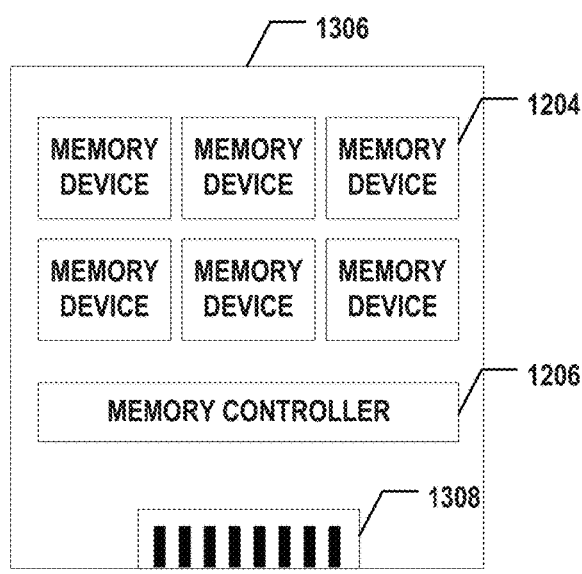
FIG. 13B illustrates a diagram of an exemplary solid-state drive (SSD) having a memory device, according to some aspects of the present disclosure.

Memory controller 1206 and one or more memory devices 1204 can be integrated into various types of storage devices, for example, be included in the same package, such as a universal Flash storage (UFS) package or an eMMC package. That is, memory system 1202 can be implemented and packaged into different types of end electronic products. In one example as shown in FIG. 13A, memory controller 1206 and a single memory device 1204 may be integrated into a memory card 1302. Memory card 1302 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1302 can further include a memory card connector 1304 coupling memory card 1302 with a host (e.g., host 1208 in FIG. 12). In another example as shown in FIG. 13B, memory controller 1206 and multiple memory devices 1204 may be integrated into an SSD 1306. SSD 1306 can further include an SSD connector 1308 coupling SSD 1306 with a host (e.g., host 1208 in FIG. 12). In some implementations, the storage capacity and/or the operation speed of SSD 1306 is greater than those of memory card 1302.

According to one aspect of the present disclosure, a method for forming a 3D memory device is disclosed. A transistor is formed in a first region on a first side of a single crystalline silicon substrate. A step layer is formed in a second region on the first side of the single crystalline silicon substrate. A channel structure extending through a stack structure and in contact with the step layer is formed. The stack structure includes interleaved dielectric layers and conductive layers on the step layer. Part of the single crystalline silicon substrate that is in the second region is removed from a second side opposite to the first side of the single crystalline silicon substrate to expose the step layer from the second side.

In some implementations, the step layer is a polysilicon layer. In some implementations, a first dielectric layer is formed to fill a recess formed by removing the part of the single crystalline silicon substrate that is in the second region.

In some implementations, the step layer is a sacrificial layer. In some implementations, the sacrificial layer is removed after removing the part of the single crystalline silicon substrate to expose the channel structure, and a polysilicon layer in contact with the channel structure is formed in the second region.

In some implementations, the polysilicon layer is doped with an N-type dopant.

In some implementations, a pad-out interconnect layer is formed on at least a remainder of the single crystalline silicon substrate.

In some implementations, prior to removing the part of the single crystalline silicon substrate that is in the second region, the single crystalline silicon substrate is thinned from the second side.

In some implementations, prior to forming the step layer in the second region, a second dielectric layer is formed in the first region to cover the transistor.

In some implementations, to form the channel structure, the dielectric layers and sacrificial layers are alternatingly deposited on the step layer, a channel hole is etched extending through the dielectric layers and the sacrificial layers, the channel structure is formed in the channel hole, and the sacrificial layers are replaced with the conductive layers.

According to another aspect of the present disclosure, a method for forming a 3D memory device is disclosed. A first semiconductor structure is formed. The first semiconductor structure includes a single crystalline silicon substrate, a first transistor on the single crystalline silicon substrate, a step layer on the single crystalline silicon substrate, and a channel structure on the step layer. A second semiconductor structure including a second transistor is formed. The first semiconductor structure and the second semiconductor structure are bonded in a face-to-face manner. Part of the single crystalline silicon substrate on which the step layer is formed is removed.

In some implementations, the step layer is a polysilicon layer. In some implementations, a first dielectric layer is formed to fill a recess formed by removing the part of the single crystalline silicon substrate.

In some implementations, the step layer is a sacrificial layer. In some implementations, the sacrificial layer is removed after removing the part of the single crystalline silicon substrate to expose the channel structure, and a polysilicon layer in contact with the channel structure is formed.

In some implementations, the polysilicon layer is doped with an N-type dopant.

In some implementations, a contact extending through the polysilicon layer is formed.

In some implementations, a pad-out interconnect layer is formed on the first semiconductor structure or the second semiconductor structure after removing the part of the single crystalline silicon substrate.

In some implementations, to form the pad-out interconnect layer, the pad-out interconnect layer is formed on at least a remainder of the single crystalline silicon substrate.

In some implementations, the bonding includes hybrid bonding.

In some implementations, to form the first semiconductor structure, the first transistor is formed in a first region on a first side of the single crystalline silicon substrate, the step layer is formed in a second region on the first side of the single crystalline silicon substrate, and the channel structure extending through a stack structure and in contact with the step layer is formed. The stack structure can include interleaved dielectric layers and conductive layers on the polysilicon layer.

In some implementations, to remove the part of the single crystalline silicon substrate, the part of the single crystalline silicon substrate is removed from a second side opposite to the first side of the single crystalline silicon substrate to form a recess.

In some implementations, to form the first semiconductor structure, prior to removing the part of the single crystalline silicon substrate, the single crystalline silicon substrate is thinned from the second side.

In some implementations, to form the first semiconductor structure, prior to forming the step layer in the second region, a second dielectric layer is formed in the first region to cover the first transistor.

In some implementations, to form the channel structure, the dielectric layers and sacrificial layers are alternatingly deposited on the step layer, a channel hole is etched extending through the dielectric layers and the sacrificial layers, the channel structure is formed in the channel hole, and the sacrificial layers are replaced with the conductive layers.

In some implementations, to form the first semiconductor structure, a first bonding layer including a first bonding contact is formed above the channel structure and the first transistor. In some implementations, to form the second semiconductor structure, a second bonding layer including a second bonding contact is formed above the second transistor. In some implementations, the first bonding contact is in contact with the second bonding contact at a bonding interface after bonding the first and second semiconductor structures.

In some implementations, to form the first semiconductor structure, the first transistor including a first gate dielectric is formed. In some implementations, to form the second semiconductor structure, the second transistor including a second gate dielectric is formed. In some implementations, a thickness of the first gate dielectric is greater than a thickness of the second gate dielectric.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a three-dimensional (3D) memory device, comprising:
   forming a transistor in a first region on a first side of a single crystalline silicon substrate;
   forming a step layer in a second region on the first side of the single crystalline silicon substrate;
   forming a channel structure extending through a stack structure and in contact with the step layer without extending through the step layer, the stack structure comprising interleaved dielectric layers and conductive layers on the step layer; and
   removing part of the single crystalline silicon substrate that is in the second region from a second side opposite to the first side of the single crystalline silicon substrate to expose the step layer from the second side and retaining another part of the single crystalline silicon substrate, corresponding to the transistor, in the first region.

2. The method of claim 1, wherein the step layer is a polysilicon layer, and the method further comprises forming a first dielectric layer to fill a recess formed by removing the part of the single crystalline silicon substrate that is in the second region.

3. The method of claim 1, wherein the step layer is a sacrificial layer, and the method further comprises:
   removing the sacrificial layer after removing the part of the single crystalline silicon substrate to expose the channel structure; and
   forming a polysilicon layer in contact with the channel structure in the second region.

4. The method of claim 2, further comprising doping the polysilicon layer with an N-type dopant.

5. The method of claim 1, further comprising forming a pad-out interconnect layer on at least a remainder of the single crystalline silicon substrate.

6. The method of claim 1, further comprising prior to removing the part of the single crystalline silicon substrate that is in the second region, thinning the single crystalline silicon substrate from the second side.

7. The method of claim 1, further comprising prior to forming the step layer in the second region, forming a second dielectric layer in the first region to cover the transistor.

8. A method for forming a three-dimensional (3D) memory device, comprising:
   forming a first semiconductor structure, the first semiconductor structure comprising a single crystalline silicon substrate, a first transistor on the single crystalline silicon substrate, a step layer on the single crystalline silicon substrate, and a channel structure on the step layer without extending into the step layer, wherein the step layer extends laterally from a region where a stack structure is formed to another region where a contact is to be formed;
   forming a second semiconductor structure comprising a second transistor;
   bonding the first semiconductor structure and the second semiconductor structure in a face-to-face manner; and
   removing part of the single crystalline silicon substrate on which the step layer is formed, and retaining another part of the single crystalline silicon substrate that corresponds to the first transistor.

9. The method of claim 8, wherein the step layer is a polysilicon layer, and the method further comprises forming a first dielectric layer to fill a recess formed by removing the part of the single crystalline silicon substrate.

10. The method of claim 8, wherein the step layer is a sacrificial layer, and the method further comprises:
    removing the sacrificial layer after removing the part of the single crystalline silicon substrate to expose the channel structure; and
    forming a polysilicon layer in contact with the channel structure.

11. The method of claim 9, further comprising doping the polysilicon layer with an N-type dopant.

12. The method of claim 9, further comprising forming the contact extending through the polysilicon layer.

13. The method of claim 8, further comprises forming a pad-out interconnect layer on the first semiconductor structure or the second semiconductor structure after removing the part of the single crystalline silicon substrate.

14. The method of claim 13, wherein forming the pad-out interconnect layer comprises forming the pad-out interconnect layer on at least a remainder of the single crystalline silicon substrate.

15. The method of claim 8, wherein forming the first semiconductor structure comprises:
    forming the first transistor in a first region on a first side of the single crystalline silicon substrate;
    forming the step layer in a second region on the first side of the single crystalline silicon substrate; and
    forming the channel structure extending through a stack structure and in contact with the step layer, the stack structure comprising interleaved dielectric layers and conductive layers on a polysilicon layer.

16. The method of claim 15, wherein removing the part of the single crystalline silicon substrate comprises:
    removing the part of the single crystalline silicon substrate from a second side opposite to the first side of the single crystalline silicon substrate to form a recess.

17. The method of claim 16, wherein forming the first semiconductor structure further comprises prior to removing the part of the single crystalline silicon substrate, thinning the single crystalline silicon substrate from the second side.

18. The method of claim 15, wherein forming the first semiconductor structure further comprises prior to forming the step layer in the second region, forming a second dielectric layer in the first region to cover the first transistor.

19. The method of claim 8, wherein
    forming the first semiconductor structure comprises forming a first bonding layer above the channel structure and the first transistor, the first bonding layer comprising a first bonding contact; and
    forming the second semiconductor structure comprises forming a second bonding layer above the second transistor, the second bonding layer comprising a second bonding contact,
    wherein the first bonding contact is in contact with the second bonding contact at a bonding interface after bonding the first and second semiconductor structures.

20. The method of claim 8, wherein
    forming the first semiconductor structure comprises forming the first transistor comprising a first gate dielectric; and
    forming the second semiconductor structure comprises forming the second transistor comprising a second gate dielectric,
    wherein a thickness of the first gate dielectric is greater than a thickness of the second gate dielectric.

* * * * *